US010673464B1

(12) United States Patent
Rahul et al.

(10) Patent No.: US 10,673,464 B1
(45) Date of Patent: Jun. 2, 2020

(54) ENCODING AND DECODING INFORMATION FOR DETECTING AND CORRECTING BIT ERRORS

(71) Applicant: Xilinx, Inc., San Jose, CA (US)

(72) Inventors: Kumar Rahul, Hyderabad (IN); Santosh Yachareni, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 46 days.

(21) Appl. No.: 16/106,725

(22) Filed: Aug. 21, 2018

(51) Int. Cl.
  *H03M 13/37* (2006.01)
  *H03M 13/00* (2006.01)
  *G06F 11/10* (2006.01)

(52) U.S. Cl.
  CPC ..... *H03M 13/3707* (2013.01); *G06F 11/1076* (2013.01); *H03M 13/611* (2013.01)

(58) Field of Classification Search
  CPC ............. H03M 13/3707; H03M 13/611; G06F 11/1076
  See application file for complete search history.

(56) References Cited

U.S. PATENT DOCUMENTS

| | | | | |
|---|---|---|---|---|
| 5,751,744 A * | 5/1998 | Babb | ................... | G06F 11/1028 714/746 |
| 8,560,927 B1 * | 10/2013 | Pagiamtzis | ............. | G06F 11/10 714/704 |
| 8,972,833 B1 * | 3/2015 | Rahul | ................. | H03M 13/098 714/785 |
| 8,972,835 B1 * | 3/2015 | Rahul | ................... | H03M 13/19 714/800 |
| 2008/0172589 A1 * | 7/2008 | Gallezot | ............... | H04L 1/0045 714/746 |
| 2012/0233498 A1 * | 9/2012 | Ramaraju | ........... | G06F 11/1064 714/23 |
| 2019/0258540 A1 * | 8/2019 | Sharon | ................ | G06F 11/1068 |

\* cited by examiner

*Primary Examiner* — Thien Nguyen
(74) *Attorney, Agent, or Firm* — Kevin T. Cuenot

(57) ABSTRACT

An apparatus includes an encoder circuit block configured to receive input data. The encoder circuit block is configured to generate a plurality of parity bits from the input data and order the input data and the plurality of parity bits to generate encoded data. The encoder circuit block is configured to generate each of the plurality of parity bits based upon selected bits of the input data and orders the input data and the plurality of parity bits so that a decoder circuit block configured to decode the encoded data is able to perform operations including, at least in part, detecting a no bit error, detecting and correcting a single bit error, detecting a double bit error, detecting and correcting an adjacent double bit error, and detecting an adjacent triple bit error. The operations are independent of a number of memory banks used to store the encoded data. The decoder circuit block may also correct an adjacent triple bit error.

20 Claims, 10 Drawing Sheets

4 MEMORY BANKS

2 MEMORY BANKS

BANK0 - 1 MEMORY BANK

| D-P | SB-D | ADB-D | ATB-D | SB-B | ADB-B | ATB-B | T5 | T4 | T3 | T2 | T1 |
|---|---|---|---|---|---|---|---|---|---|---|---|
| P0 | 0 | | | 00000 | | | 0 | 0 | 0 | 0 | 0 |
| P1 | 1 | 1 | | 00001 | 00001 | | 0 | 0 | 0 | 0 | 1 |
| d1 | 7 | 6 | 6 | 00111 | 00110 | 00110 | 0 | 0 | 1 | 1 | 1 |
| d2 | 11 | 12 | 13 | 01011 | 01100 | 01101 | 0 | 1 | 0 | 1 | 1 |
| d3 | 19 | 24 | 31 | 10011 | 11000 | 11111 | 1 | 0 | 0 | 1 | 1 |
| d4 | 22 | 5 | 14 | 10110 | 00101 | 01110 | 1 | 0 | 1 | 1 | 0 |
| d5 | 25 | 15 | 28 | 11001 | 01111 | 11100 | 1 | 1 | 0 | 0 | 1 |
| d6 | 26 | 3 | 21 | 11010 | 00011 | 10101 | 1 | 1 | 0 | 1 | 0 |
| d7 | 5 | 31 | 6 | 00101 | 11111 | 00110 | 0 | 0 | 1 | 0 | 1 |
| P4 | 8 | 13 | 23 | 01000 | 01101 | 10111 | 0 | 1 | 0 | 0 | 0 |
| d8 | 17 | 25 | 28 | 10001 | 11001 | 11100 | 1 | 0 | 0 | 0 | 1 |
| P2 | 2 | 19 | 27 | 00010 | 10011 | 11011 | 0 | 0 | 0 | 1 | 0 |
| d9 | 12 | 14 | 31 | 01100 | 01110 | 11111 | 0 | 1 | 1 | 0 | 0 |
| P5 | 16 | 28 | 30 | 10000 | 11100 | 11110 | 1 | 0 | 0 | 0 | 0 |
| d10 | 18 | 2 | 14 | 10010 | 00010 | 01110 | 1 | 0 | 0 | 1 | 0 |
| P3 | 4 | 22 | 6 | 00100 | 10110 | 00110 | 0 | 0 | 1 | 0 | 0 |
| d11 | 3 | 7 | 21 | 00011 | 00111 | 10101 | 0 | 0 | 0 | 1 | 1 |
| d12 | 9 | 10 | 14 | 01001 | 01010 | 01110 | 0 | 1 | 0 | 0 | 1 |
| d13 | 20 | 29 | 30 | 10100 | 11101 | 11110 | 1 | 0 | 1 | 0 | 0 |
| d14 | 10 | 30 | 23 | 01010 | 11110 | 10111 | 0 | 1 | 0 | 1 | 0 |
| d15 | 24 | 18 | 6 | 11000 | 10010 | 00110 | 1 | 1 | 0 | 0 | 0 |
| d16 | 15 | 23 | 29 | 01111 | 10111 | 11101 | 0 | 1 | 1 | 1 | 1 |

FIG. 2

| D-P | SB-D | ADB-D | ATB-D | SB-B | ADB-B | ATB-B | T6 | T5 | T4 | T3 | T2 | T1 |
|---|---|---|---|---|---|---|---|---|---|---|---|---|
| P0 | 0 | | | 000000 | | | 0 | 0 | 0 | 0 | 0 | 0 |
| P1 | 1 | 1 | | 000001 | 000001 | | 0 | 0 | 0 | 0 | 0 | 1 |
| P2 | 2 | 3 | 3 | 000010 | 000011 | 000011 | 0 | 0 | 0 | 0 | 1 | 0 |
| P3 | 4 | 6 | 7 | 000100 | 000110 | 000111 | 0 | 0 | 0 | 1 | 0 | 0 |
| d1 | 6 | 2 | 0 | 000110 | 000010 | 000000 | 0 | 0 | 0 | 1 | 1 | 0 |
| P4 | 8 | 14 | 10 | 001000 | 001110 | 001010 | 0 | 0 | 1 | 0 | 0 | 0 |
| P5 | 16 | 24 | 30 | 010000 | 011000 | 011110 | 0 | 1 | 0 | 0 | 0 | 0 |
| d2 | 20 | 4 | 12 | 010100 | 000100 | 001100 | 0 | 1 | 0 | 1 | 0 | 0 |
| d3 | 24 | 12 | 28 | 011000 | 001100 | 011100 | 0 | 1 | 1 | 0 | 0 | 0 |
| P6 | 32 | 56 | 44 | 100000 | 111000 | 101100 | 1 | 0 | 0 | 0 | 0 | 0 |
| d4 | 5 | 37 | 61 | 000101 | 100101 | 111101 | 0 | 0 | 0 | 1 | 0 | 1 |
| d5 | 17 | 20 | 52 | 010001 | 010100 | 110100 | 0 | 1 | 0 | 0 | 0 | 1 |
| d6 | 33 | 48 | 53 | 100001 | 110000 | 110101 | 1 | 0 | 0 | 0 | 0 | 1 |
| d7 | 9 | 40 | 57 | 001001 | 101000 | 111001 | 0 | 0 | 1 | 0 | 0 | 1 |
| d8 | 18 | 27 | 58 | 010010 | 011011 | 111010 | 0 | 1 | 0 | 0 | 1 | 0 |
| d9 | 36 | 54 | 63 | 100100 | 110110 | 111111 | 1 | 0 | 0 | 1 | 0 | 0 |
| d10 | 13 | 41 | 59 | 001101 | 101001 | 111011 | 0 | 0 | 1 | 1 | 0 | 1 |
| d11 | 23 | 26 | 62 | 010111 | 011010 | 111110 | 0 | 1 | 0 | 1 | 1 | 1 |
| d12 | 34 | 53 | 56 | 100010 | 110101 | 111000 | 1 | 0 | 0 | 0 | 1 | 0 |
| d13 | 40 | 10 | 29 | 101000 | 001010 | 011101 | 1 | 0 | 1 | 0 | 0 | 0 |
| d14 | 45 | 5 | 39 | 101101 | 000101 | 100111 | 1 | 0 | 1 | 1 | 0 | 1 |
| d15 | 50 | 31 | 55 | 110010 | 011111 | 110111 | 1 | 1 | 0 | 0 | 1 | 0 |
| d16 | 35 | 17 | 60 | 100011 | 010001 | 111100 | 1 | 0 | 0 | 0 | 1 | 1 |

FIG. 3

| D-P | SB-D | ADB-D | ATB-D | SB-B | ADB-B | ATB-B | T6 | T5 | T4 | T3 | T2 | T1 |
|---|---|---|---|---|---|---|---|---|---|---|---|---|
| P0 | 0 | | | 000000 | | | 0 | 0 | 0 | 0 | 0 | 0 |
| d1 | 13 | 13 | | 001101 | 001101 | | 0 | 0 | 1 | 1 | 0 | 1 |
| d2 | 23 | 26 | 26 | 010111 | 011010 | 011010 | 0 | 1 | 0 | 1 | 1 | 1 |
| d3 | 15 | 24 | 21 | 001111 | 011000 | 010101 | 0 | 0 | 1 | 1 | 1 | 1 |
| d4 | 27 | 20 | 3 | 011011 | 010100 | 000011 | 0 | 1 | 1 | 0 | 1 | 1 |
| d5 | 29 | 6 | 9 | 011101 | 000110 | 001001 | 0 | 1 | 1 | 1 | 0 | 1 |
| d6 | 30 | 3 | 24 | 011110 | 000011 | 011000 | 0 | 1 | 1 | 1 | 1 | 0 |
| d7 | 39 | 57 | 36 | 100111 | 111001 | 100100 | 1 | 0 | 0 | 1 | 1 | 1 |
| d8 | 43 | 12 | 18 | 101011 | 001100 | 010010 | 1 | 0 | 1 | 0 | 1 | 1 |
| d9 | 46 | 5 | 34 | 101110 | 000101 | 100010 | 1 | 0 | 1 | 1 | 1 | 0 |
| d10 | 51 | 29 | 54 | 110011 | 011101 | 110110 | 1 | 1 | 0 | 0 | 1 | 1 |
| d11 | 45 | 30 | 48 | 101101 | 011110 | 110000 | 1 | 0 | 1 | 1 | 0 | 1 |
| d12 | 58 | 23 | 36 | 111010 | 010111 | 100100 | 1 | 1 | 1 | 0 | 1 | 0 |
| P1 | 1 | 59 | 22 | 000001 | 111011 | 010110 | 0 | 0 | 0 | 0 | 0 | 1 |
| d13 | 5 | 4 | 62 | 000101 | 000100 | 111110 | 0 | 0 | 0 | 1 | 0 | 1 |
| P2 | 2 | 7 | 6 | 000010 | 000111 | 000110 | 0 | 0 | 0 | 0 | 1 | 0 |
| d14 | 11 | 9 | 12 | 001011 | 001001 | 001100 | 0 | 0 | 1 | 0 | 1 | 1 |
| d15 | 10 | 1 | 3 | 001010 | 000001 | 000011 | 0 | 0 | 1 | 0 | 1 | 0 |
| d16 | 19 | 25 | 18 | 010011 | 011001 | 010010 | 0 | 1 | 0 | 0 | 1 | 1 |
| P4 | 8 | 27 | 17 | 001000 | 011011 | 010001 | 0 | 0 | 1 | 0 | 0 | 0 |
| d17 | 7 | 15 | 28 | 000111 | 001111 | 011100 | 0 | 0 | 0 | 1 | 1 | 1 |
| P6 | 32 | 39 | 47 | 100000 | 100111 | 101111 | 1 | 0 | 0 | 0 | 0 | 0 |
| d18 | 14 | 46 | 41 | 001110 | 101110 | 101001 | 0 | 0 | 1 | 1 | 1 | 0 |
| d19 | 40 | 38 | 6 | 101000 | 100110 | 000110 | 1 | 0 | 1 | 0 | 0 | 0 |
| P5 | 16 | 56 | 54 | 010000 | 111000 | 110110 | 0 | 1 | 0 | 0 | 0 | 0 |
| d20 | 33 | 49 | 25 | 100001 | 110001 | 011001 | 1 | 0 | 0 | 0 | 0 | 1 |
| d21 | 35 | 2 | 18 | 100011 | 000010 | 010010 | 1 | 0 | 0 | 0 | 1 | 1 |
| d22 | 20 | 55 | 22 | 010100 | 110111 | 010110 | 0 | 1 | 0 | 1 | 0 | 0 |
| d23 | 38 | 50 | 17 | 100110 | 110010 | 010001 | 1 | 0 | 0 | 1 | 1 | 0 |
| d24 | 52 | 18 | 6 | 110100 | 010010 | 000110 | 1 | 1 | 0 | 1 | 0 | 0 |
| d25 | 37 | 17 | 55 | 100101 | 010001 | 110111 | 1 | 0 | 0 | 1 | 0 | 1 |
| d26 | 53 | 16 | 36 | 110101 | 010000 | 100100 | 1 | 1 | 0 | 1 | 0 | 1 |
| d27 | 63 | 10 | 47 | 111111 | 001010 | 101111 | 1 | 1 | 1 | 1 | 1 | 1 |
| d28 | 31 | 32 | 21 | 011111 | 100000 | 010101 | 0 | 1 | 1 | 1 | 1 | 1 |
| d29 | 44 | 51 | 12 | 101100 | 110011 | 001100 | 1 | 0 | 1 | 1 | 0 | 0 |
| P3 | 4 | 40 | 55 | 000100 | 101000 | 110111 | 0 | 0 | 0 | 1 | 0 | 0 |
| d30 | 49 | 53 | 25 | 110001 | 110101 | 011001 | 1 | 1 | 0 | 0 | 0 | 1 |
| d31 | 57 | 8 | 12 | 111001 | 001000 | 001100 | 1 | 1 | 1 | 0 | 0 | 1 |
| d32 | 42 | 19 | 34 | 101010 | 010011 | 100010 | 1 | 0 | 1 | 0 | 1 | 0 |

FIG. 4

| D-P | SB-D | ADB-D | ATB-D | SB-B | ADB-B | ATB-B | T7 | T6 | T5 | T4 | T3 | T2 | T1 |
|---|---|---|---|---|---|---|---|---|---|---|---|---|---|
| P1 | 1 | | | 0000001 | | | 0 | 0 | 0 | 0 | 0 | 0 | 1 |
| P2 | 2 | 13 | | 0000010 | 0001101 | | 0 | 0 | 0 | 0 | 0 | 1 | 0 |
| P3 | 4 | 6 | 7 | 0000100 | 0000110 | 0000111 | 0 | 0 | 0 | 0 | 1 | 0 | 0 |
| P4 | 8 | 12 | 14 | 0001000 | 0001100 | 0001110 | 0 | 0 | 0 | 1 | 0 | 0 | 0 |
| P5 | 16 | 24 | 28 | 0010000 | 0011000 | 0011100 | 0 | 0 | 1 | 0 | 0 | 0 | 0 |
| P6 | 32 | 48 | 56 | 0100000 | 0110000 | 0111000 | 0 | 1 | 0 | 0 | 0 | 0 | 0 |
| P7 | 64 | 96 | 112 | 1000000 | 1100000 | 1110000 | 1 | 0 | 0 | 0 | 0 | 0 | 0 |
| P0 | 0 | 64 | 96 | 0000000 | 1000000 | 1100000 | 0 | 0 | 0 | 0 | 0 | 0 | 0 |
| d1 | 5 | 5 | 69 | 0000101 | 0000101 | 1000101 | 0 | 0 | 0 | 0 | 1 | 0 | 1 |
| d2 | 10 | 15 | 15 | 0001010 | 0001111 | 0001111 | 0 | 0 | 0 | 1 | 0 | 1 | 0 |
| d3 | 3 | 9 | 12 | 0000011 | 0001001 | 0001100 | 0 | 0 | 0 | 0 | 0 | 1 | 1 |
| d4 | 17 | 18 | 24 | 0010001 | 0010010 | 0011000 | 0 | 0 | 1 | 0 | 0 | 0 | 1 |
| d5 | 6 | 23 | 20 | 0000110 | 0010111 | 0010100 | 0 | 0 | 0 | 0 | 1 | 1 | 0 |
| d6 | 13 | 11 | 26 | 0001101 | 0001011 | 0011010 | 0 | 0 | 0 | 1 | 1 | 0 | 1 |
| d7 | 18 | 31 | 25 | 0010010 | 0011111 | 0011001 | 0 | 0 | 1 | 0 | 0 | 1 | 0 |
| d8 | 22 | 4 | 9 | 0010110 | 0000100 | 0001001 | 0 | 0 | 1 | 0 | 1 | 1 | 0 |
| d9 | 23 | 1 | 19 | 0010111 | 0000001 | 0010011 | 0 | 0 | 1 | 0 | 1 | 1 | 1 |
| d10 | 31 | 8 | 30 | 0011111 | 0001000 | 0011110 | 0 | 0 | 1 | 1 | 1 | 1 | 1 |
| d11 | 33 | 62 | 41 | 0100001 | 0111110 | 0101001 | 0 | 1 | 0 | 0 | 0 | 0 | 1 |
| d12 | 35 | 2 | 29 | 0100011 | 0000010 | 0011101 | 0 | 1 | 0 | 0 | 0 | 1 | 1 |
| d13 | 36 | 7 | 38 | 0100100 | 0000111 | 0100110 | 0 | 1 | 0 | 0 | 1 | 0 | 0 |
| d14 | 42 | 14 | 45 | 0101010 | 0001110 | 0101101 | 0 | 1 | 0 | 1 | 0 | 1 | 0 |
| d15 | 21 | 63 | 27 | 0010101 | 0111111 | 0011011 | 0 | 0 | 1 | 0 | 1 | 0 | 1 |
| d16 | 11 | 30 | 52 | 0001011 | 0011110 | 0110100 | 0 | 0 | 0 | 1 | 0 | 1 | 1 |
| d17 | 34 | 41 | 60 | 0100010 | 0101001 | 0111100 | 0 | 1 | 0 | 0 | 0 | 1 | 0 |
| d18 | 65 | 99 | 104 | 1000001 | 1100011 | 1101000 | 1 | 0 | 0 | 0 | 0 | 0 | 1 |
| d19 | 37 | 100 | 70 | 0100101 | 1100100 | 1000110 | 0 | 1 | 0 | 0 | 1 | 0 | 1 |
| d20 | 40 | 13 | 76 | 0101000 | 0001101 | 1001100 | 0 | 1 | 0 | 1 | 0 | 0 | 0 |
| d21 | 50 | 26 | 63 | 0110010 | 0011010 | 0111111 | 0 | 1 | 1 | 0 | 0 | 1 | 0 |
| d22 | 66 | 112 | 88 | 1000010 | 1110000 | 1011000 | 1 | 0 | 0 | 0 | 0 | 1 | 0 |
| d23 | 39 | 101 | 87 | 0100111 | 1100101 | 1010111 | 0 | 1 | 0 | 0 | 1 | 1 | 1 |
| d24 | 49 | 22 | 84 | 0110001 | 0010110 | 1010100 | 0 | 1 | 1 | 0 | 0 | 0 | 1 |
| d25 | 67 | 114 | 85 | 1000011 | 1110010 | 1010101 | 1 | 0 | 0 | 0 | 0 | 1 | 1 |
| d26 | 73 | 10 | 59 | 1001001 | 0001010 | 0111011 | 1 | 0 | 0 | 1 | 0 | 0 | 1 |
| d27 | 48 | 121 | 58 | 0110000 | 1111001 | 0111010 | 0 | 1 | 1 | 0 | 0 | 0 | 0 |
| d28 | 68 | 116 | 61 | 1000100 | 1110100 | 0111101 | 1 | 0 | 0 | 0 | 1 | 0 | 0 |
| d29 | 43 | 111 | 95 | 0101011 | 1101111 | 1011111 | 0 | 1 | 0 | 1 | 0 | 1 | 1 |
| d30 | 54 | 29 | 89 | 0110110 | 0011101 | 1011001 | 0 | 1 | 1 | 0 | 1 | 1 | 0 |
| d31 | 71 | 113 | 90 | 1000111 | 1110001 | 1011010 | 1 | 0 | 0 | 0 | 1 | 1 | 1 |
| d32 | 44 | 107 | 93 | 0101100 | 1101011 | 1011101 | 0 | 1 | 0 | 1 | 1 | 0 | 0 |

BANK0 - 1 MEMORY BANK

| P0 | d1 | ○○○ | d12 | P1 | d13 | P2 | d14 | d15 | d16 | d17 | P4 | P6 | d18 | d19 | P5 | d20 | ○○○ | d29 | P3 | d30 | d31 | d32 |

2 MEMORY BANKS

BANK0:
| P0 | d1 | | | | | | | | d12 | P1 | d13 | P2 | d14 | d15 | d16 |

BANK1:
| P4 | d17 | P6 | d18 | d19 | P5 | d20 | ○○○ | d29 | P3 | d30 | d31 | d32 |

4 MEMORY BANKS

BANK0:
| P0 | d1 | d2 | d3 | d4 | d5 | d6 | d7 | d8 | d9 |

BANK1:
| d10 | d11 | d12 | P1 | d13 | P2 | d14 | d15 | d16 | P4 |

BANK2:
| d17 | P6 | d18 | d19 | P5 | d20 | d21 | d22 | d23 | d24 |

BANK3:
| d25 | d26 | d27 | d28 | d29 | P3 | d30 | d31 | d32 |

FIG. 12

ENCODING AND DECODING INFORMATION FOR DETECTING AND CORRECTING BIT ERRORS

TECHNICAL FIELD

This disclosure relates to integrated circuit devices (ICs) and, more particularly, to encoding and decoding information for an IC.

BACKGROUND

As memory bit cells of ICs get smaller and/or denser, the likelihood of a Single Event Upset ("SEU") impacting more than one memory bit cell at a time increases. Adding parity bits for resolving data corruption using an Error-Correcting Code (ECC) may address data corruption at least to a limited extent. One way of addressing larger amounts of data corruption, in view of increased density of memory bit cells, is to add more parity bits. Using additional parity bits, however, can adversely affect the bandwidth of memories at a time when increased memory bandwidth is highly valued.

SUMMARY

In one or more embodiments, an apparatus includes an encoder circuit block. The encoder circuit block is configured to receive input data. The encoder circuit block is configured to generate a plurality of parity bits from the input data and order the input data and the plurality of parity bits to generate encoded data. The encoder circuit block is configured to generate each of the plurality of parity bits based upon selected bits of the input data, and order the input data and the plurality of parity bits so that a decoder circuit block configured to decode the encoded data is able to perform operations including, at least in part, detecting a no bit error, detecting and correcting a single bit error, detect a double bit error, detecting and correcting an adjacent double bit error, and detecting an adjacent triple bit error. The operations are independent of a number of memory banks of a memory used to store the encoded data. In particular embodiments, the decoder circuit block is further configured to perform operations including correcting adjacent triple bit errors.

In one or more embodiments, an apparatus includes a decoder circuit block. The decoder circuit block is configured to receive encoded data and generate a plurality of syndrome bits from the encoded data. The decoder circuit block is configured, in response to generating the plurality of syndrome bits, to perform operations including, at least in part, detecting a no bit error, detecting and correcting a single bit error, detecting a double bit error, detecting and correcting an adjacent double bit error, and detecting an adjacent triple bit error. The operations are independent of a number of memory banks of a memory used to store the encoded data. In particular embodiments, the decoder circuit block is further configured to perform operations including correcting adjacent triple bit errors.

In one or more embodiments, a method of encoding data for error correction includes receiving input data, generating a plurality of parity bits for the input data based on selected bits of the input data, arranging the input data into encoded data by ordering the input data and the plurality of parity bits so that a decoder circuit block configured to decode the encoded data performs operations including detecting a no bit error, detecting and correcting a single bit error, detecting a double bit error, detecting and correcting an adjacent double bit error, and detecting an adjacent triple bit error, and storing the encoded data in a memory. The operations are independent of a number of memory banks within the memory.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 2 illustrates an example ECC implementation.
FIG. 3 illustrates another example ECC implementation.
FIG. 4 illustrates another example ECC implementation.
FIG. 5 illustrates another example ECC implementation.
FIG. 11 illustrates an example of a conventional error correcting code implementation intended for use with a four bank memory.
FIG. 12 illustrates another example of the ECC(39,32) implementation of FIG. 4.

DETAILED DESCRIPTION

Figure 1:
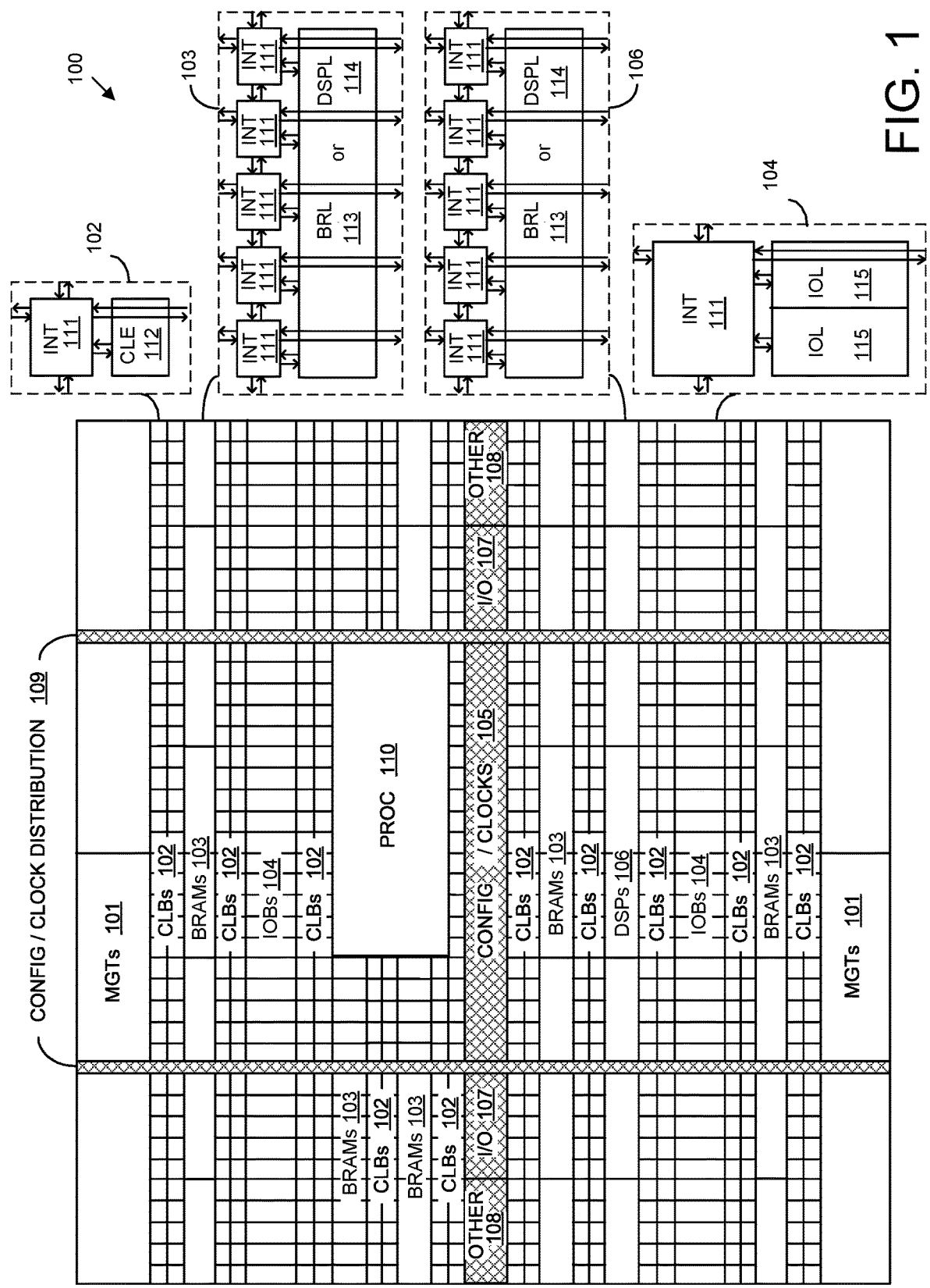
FIG. 1 illustrates an example architecture for an IC.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuit devices (ICs) and, more particularly, to encoding and decoding information for an IC. Hamming Codes are error correcting codes used for data transmission. Hamming Codes may be provided for a variety of different word lengths. In accordance with the inventive arrangements described herein, embodiments are described that provide improved error detection and/or correction compared to conventional Hamming Code implementations.

Within this disclosure, Error Correcting Codes (ECCs) are provided that support detection and/or correction of more corrupted bits than equivalently sized Hamming Code implementations. Examples of conventional Hamming Code implementations include H(39,32) and H(22,16). H(39,32) adds 7 parity bits to 32 data bits resulting in a code word (e.g., encoded data) of 39 bits in total. H(22,16) adds 6 parity bits to 16 data bits resulting in a code word of 22 bits in total. Both H(39,32) and H(22,16) are capable of detecting a no error case, detecting and correcting a single bit error, and detecting a double bit (e.g., 2 bit) error.

In one or more embodiments, ECC implementations described herein, using the same number of parity bits as conventional Hamming Codes, are capable of detecting a no error case, detecting and correcting a single bit error, detecting a double bit error, detecting and correcting an adjacent double bit error, and detecting an adjacent triple bit error. In one or more other embodiments, by adding an additional parity bit, ECC implementations described herein are capable of detecting a no error case, detecting and correcting a single bit error, detecting a double bit error, detecting and correcting an adjacent double bit error, and detecting and correcting an adjacent triple bit error.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

For purposes of illustration, example ICs and/or IC architectures are described below in which one or more embodiments described herein can be implemented. The example ICs and/or IC architectures are provided for purposes of illustration and not limitation. It should be appreciated that the embodiments described herein may be implemented in other varieties of ICs beyond those specifically noted.

Programmable ICs refer to a class of ICs that can be programmed to perform specified functions. One example of a programmable IC is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

FIG. 1 illustrates an example architecture 100 for an IC. In one aspect, architecture 100 may be implemented within a programmable IC. For example, architecture 100 may be used to implement an FPGA. Architecture 100 may also be representative of a system-on-chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 100 includes several different types of programmable circuit, e.g., logic, blocks. For example, architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 may include a configurable logic element (CLE) 112 that may be programmed to implement user logic plus a single INT 111. A BRAM 103 may include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also may be used. A DSP tile 106 may include a DSP logic element (DSPL) 114 in addition to an appropriate number of INTs 111. An 10B 104 may include, for example, two instances of an I/O logic element (IOL) 115 in addition to one instance of an INT 111. The actual I/O pads connected to IOL 115 may not be confined to the area of IOL 115.

In the example pictured in FIG. 1, a columnar area near the center of the die, e.g., formed of regions 105, 107, and 108, may be used for configuration, clock, and other control logic. Horizontal areas 109 extending from this column may be used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks may be programmable blocks and/or dedicated circuitry. For example, a processor block depicted as PROC 110 spans several columns of CLBs and BRAMs.

In one aspect, PROC 110 may be implemented as dedicated circuitry, e.g., as a hardwired processor, that is fabricated as part of the die that implements the programmable circuitry of the IC. PROC 110 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 may be omitted from architecture 100 and replaced with one or more of the other varieties of the programmable blocks described. Further, such blocks may be utilized to form a "soft processor" in that the various blocks of programmable circuitry may be used to form a processor that can execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 1 that are external to PROC 110 such as CLBs 102 and BRAMs 103 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 110 or a soft processor. In some cases, architecture 100 includes a dedicated configuration processor that loads the configuration bitstream to the appropriate configuration memory and/or processor memory. The dedicated configuration processor does not execute user-specified program code. In other cases, architecture 100 may utilize PROC 110 to receive the configuration bitstream, load the configuration bitstream into appropriate configuration memory, and/or extract program code for execution.

FIG. 1 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 110 within the IC are for purposes of illustration only and are not intended as limitations.

As discussed, reduction in features sizes in ICs leads to a reduction in the size of memory bit cells. The reduced size of memory bit cells coincides with an increase in likelihood, or probability, of an SEU event flipping larger numbers of bits stored in such memory bit cells. In cases where N:1 column multiplexing is used in BRAMs, where N is 4 or 8, the multiplexing helps in correcting N consecutive bit errors in N different words in N clock cycles. If the SEU event upsets more than N consecutive memory bit cells and less than "2N+1" consecutive memory bit cells, conventional Hamming Code implementations are only able to detect, but not correct, the two bit error. Since a single SEU event is capable of causing damage to "N+1" consecutive memory bit cells and less than "2N+1" consecutive memory bit cells, this creates a scenario where there could be a minimum of one set of two adjacent bits in error and a maximum of N sets of two adjacent bits in error. The embodiments described herein are capable of correcting a maximum of N sets of two adjacent bits in error in N clock cycles.

For example, when using a conventional H(39,32) codes with 4:1 column multiplexing, it is possible to correct four consecutive bits in error in four different words in four clock cycles. If the SEU event upsets more than four consecutive memory bit cells and less than nine consecutive bit cells, conventional H(39,32) codes can only detect, but not correct, the two bit error.

A single SEU event causing damage to five consecutive memory bit cells and less than nine consecutive memory bit cells may lead to a scenario where there could be a minimum of one set of two adjacent bits in error or a maximum of four sets of two adjacent bits in error. In accordance with the inventive arrangements described herein, a maximum of four sets of two adjacent bits in error in four clock cycles can be detected and corrected. If the SEU event upsets more than eight consecutive memory bit cells and less than 13 consecutive memory bit cells, conventional Hamming Codes cannot detect the three adjacent bit errors. A single SEU event causing damage to nine consecutive memory bit cells and less than 13 consecutive memory bit cells may lead to a scenario where there could be a minimum of one set of three adjacent bits in error or four sets of three adjacent bits in error. The ECC(39,32) implementation described herein, for example, is capable of detecting a maximum of four sets of three adjacent bits in error in four clock cycles. The ECC(40,32) implementation is capable of detecting and correcting all possible combinations of three adjacent bits in error.

In one or more embodiments, the ECC implementations described within this disclosure in connection with FIGS. 2-5 are capable of operating as described herein to detect and/or correct bit errors whether multiplexing among multiple memory banks (e.g., 4) is used or a single memory bank is used. Some encoding/decoding schemes, for example, rely upon the use of multiplexing among multiple memory banks to achieve the stated bit error detection and/or correction capabilities. The inventive arrangements described herein are capable of providing error detection and correction in the case where the memory has a single bank or the memory includes or is partitioned into multiple, different banks. In this regard, the ECC implementations described herein in connection with FIGS. 2-5 are independent of the number of banks implemented within the memory or "bank independent".

FIG. 2 illustrates an example ECC implementation. As pictured, FIG. 2 illustrates an ECC Matrix that may be used for encoding and/or decoding data. The example ECC implementation of FIG. 2, referred to herein as ECC(22,16), adds 6 parity bits to 16 data bits. Using the example ECC implementation of FIG. 2, a system is capable of detecting a no error case, detecting and correcting a single bit error, detecting a double bit error, detecting and correcting adjacent double bit errors, and detecting adjacent triple bit errors. Thus, ECC(22,16) provides improved error detection and correction compared to a Hamming Code implementation such as H(22,16) with the same number of data and parity bits. Further, the ECC implementation of FIG. 2 is capable of providing approximately 1.5× faster operation than conventional cyclic codes such as Bose-Chaudhuri-Hocquenghem (BCH) codes.

Referring to FIG. 2, the column labeled "D-P" lists the relative positions of data bits and parity bits for a code word. Data bits are shown as "d1", "d2", "d3", etc. Parity bits are shown as "P0", "P1", "P2", etc. The code word refers to the data bits and all generated parity bits re-ordered in accordance with column "D-P" starting from bit position 0 at the top to bit position 21 at the bottom.

The column labeled "SB-D" lists the decimal value of the syndrome when a single bit error is detected for the particular bit of the row. The column labeled "SB-B" lists the binary value of the syndrome when a single bit error is detected for the particular bit of the row. For purposes of discussion, the "syndrome" refers to syndrome bits S1 to SN, where N is the last syndrome bit, e.g., S5 in this example. In this regard, the "syndrome" excludes syndrome bit S0. Within FIGS. 2-5, syndromes are provided for the various error conditions in both decimal and binary. It should be appreciated that columns that correspond to same error conditions but use different number systems (e.g., SB-D and SB-B) are considered equivalent. As such, throughout this disclosure, reference to a particular column or syndrome in decimal may also refer to the corresponding column or syndrome expressed in binary and vice versa.

In the example of FIG. 2, each decimal value within column SB-D (and correspondingly each binary value within column SB-B) is unique. For purposes of illustration, column SB-D defines a particular "space". The term "space", in reference to bit errors and syndromes within this disclosure, refers to one or more columns of syndromes for specified bit error conditions. For example, the single bit error space refers to column SB-D (or column SB-B). In this regard, in the example of FIG. 2, each syndrome corresponding to a single bit error within the single bit error space (e.g., column SB-D) is unique. In other words, no syndrome is repeated in column SB-D.

Because each syndrome in column SB-D is unique, each syndrome is capable of identifying a particular bit of the code word that is corrupt (e.g., flipped). As such, the occurrence of a particular syndrome during decoding of a code word not only indicates the detection or occurrence of a single bit error, but also specifies the particular bit of the code word that requires correcting. For example, a syndrome value of 11 in decimal in column SB-D (corresponding to a binary value of "01011" in column SB-B) indicates that the value of bit d2 of a code word is incorrect.

The column labeled "ADB-D" lists the decimal value of the syndrome when an adjacent double bit (an adjacent two bit) error is detected. The column labeled "ADB-B" lists the binary value of the syndrome when an adjacent double bit error is detected. Since there are "x" total bits (parity bits plus data bits), there are "x−1" possible adjacent double bit errors. In the example of FIG. 2, with a total of 22 bits in the code word (data bits plus parity bits), there are 21 possible adjacent double bit errors.

In the example of FIG. 2, each decimal value within column ADB-D (and correspondingly each binary value within column ADB-B) is unique. For purposes of illustration, column ADB-D defines an adjacent double bit space. In the example of FIG. 2, each syndrome corresponding to an adjacent double bit error within the adjacent double bit error space is unique. In other words, no syndrome is repeated in column ADB-D.

Because each syndrome in column ADB-D is unique, each syndrome is capable of identifying a particular adjacent double bit error. As such, the occurrence of a particular syndrome during decoding of a code word not only indicates the occurrence of an adjacent double bit error, but also specifies the particular adjacent double bits of the code word that require correcting. For example, a syndrome value of 12 in decimal in column ADB-D (corresponding to a binary value of "01100" in column ADB-B) indicates that the values of bits d2 and d1 are incorrect (e.g., the value of the bit position in the same row as the referenced syndrome and the value of the bit position or row immediately above).

The column labeled "ATB-D" lists the decimal value of the syndrome when an adjacent triple bit (an adjacent three bit) error is detected. The column labeled "ATB-B" lists the binary value of the syndrome when an adjacent triple bit error is detected. Since there are "x" total bits (parity bits plus data bits), there are "x−2" possible adjacent triple bit errors. In the example of FIG. 2, with a total of 22 bits in the code word, there are 20 possible adjacent triple bit errors.

In the example of FIG. 2, decimal values within column ATB-D (and correspondingly binary values within column ATB-B) are not unique. In other words, one or more syndromes are repeated in column ATB-D. For purposes of illustration, column ATB-D defines an adjacent triple bit space. In the example of FIG. 2, one or more syndromes in the adjacent triple bit error space may be repeated. Because syndromes in column ATB-D are not unique, the occurrence of a syndrome in ATB-D indicates the occurrence of an adjacent triple bit error in a code word, but not the particular adjacent triple bits of the code word that require correcting.

In the example of FIG. 2, parity bit P0 is used to differentiate between conditions where the code word has odd parity and even parity. For example, in determining that any single bit error is detected, P0 is high (e.g., has a value of 1) to maintain an even overall parity. In determining that any adjacent double bit error has occurred, parity bit P0 is low (e.g., has a value of 0) to maintain the even overall parity. In determining that any adjacent triple bit error has occurred, parity bit P0 is high to maintain the even overall parity.

Referring again to the single bit error space and the adjacent double bit error space, there may be a syndrome of the single bit error space that is used in the adjacent double bit error space (or vice versa) since parity bit P0 is used to differentiate between the occurrence of a single bit error and an adjacent double bit error. For example, a syndrome value of 5 indicates a single bit error in d7 when P0 is 1, but indicates an adjacent double bit error in d4 and d3 when P0 is 0. Thus, a syndrome corresponding to a single bit error can be the same, e.g., have a same value, as a syndrome corresponding to an adjacent double bit error. As noted, the parity bit P0 will be high for single bit errors and low for adjacent double bit errors. A same situation occurs for the adjacent double bit error space and the adjacent triple bit error space.

Because P0 is high for both single bit errors and adjacent triple bit errors, however, the syndromes of the single bit error space must be mutually exclusive with the syndromes of the adjacent triple bit error space. In other words, a syndrome used to indicate the occurrence of a single bit error may not be used to indicate the occurrence of any adjacent triple bit error and vice versa. Each syndrome of the combined space formed of the single bit error space and the adjacent triple bit error space are unique.

For purposes of encoding, P1 is calculated as the exclusive OR (XOR) of each bit position having a value of 1 in column T1 (where "T" represents "term"). P2 is calculated as the XOR of each bit position having a value of 1 in column T2. P3 is calculated as the XOR of each bit position having a value of 1 in column T3. P4 is calculated as the XOR of each bit position having a value of 1 in column T4. P5 is calculated as the XOR of each bit position having a value of 1 in column T5. P0 is calculated as the XOR of each bit position d1 to d22 and each of P1 to P5.

Based upon the foregoing and columns T1 to T5, an encoder is implemented to generate parity bits P0 to P5 using the expressions of List 1 below. Within the expressions included within this disclosure, XOR operations are indicated as "^".

List 1

$P1 = d1\^d2\^d3\^d5\^d7\^d8\^d11\^d12\^d16$ $P2 = d1\^d2\^d3\^d4\^d6\^d10\^d11\^d14\^d16$ $P3 = d1\^d4\^d7\^d9\^d13\^d16$ $P4 = d2\^d5\^d6\^d9\^d12\^d14\^d15\^d16$ $P5 = d3\^d4\^d5\^d6\^d8\^d10\^d13\^d15$ $P0 = d1\^d2\^d3\^d4\^d5\^d6\^d7\^d8\^d9\^d10\^d11\^d12\^d13\^d14\^d15\^d16\^d17\^d18\^d19\^d20\^d21\^d22\^P1\^P2\^P3\^P4\^P5$

For purposes of decoding, syndrome S1 is calculated as the XOR of each bit position having a value of 1 in column T1 and P1. Syndrome S2 is calculated as the XOR of each bit position having a value of 1 in column T2 and P2. Syndrome S3 is calculated as the XOR of each bit position having a value of 1 in column T3 and P3. Syndrome S4 is calculated as the XOR of each bit position having a value of 1 in column T4 and P4. Syndrome S5 is calculated as the XOR of each bit position having a value of 1 in column T5 and P5. Syndrome S0 is calculated as the XOR of each bit position d1 to d16 and each of P0 to P5.

Accordingly, a decoder is implemented to generate syndrome bits S0 to S5 using the expressions of List 2 below. As noted, syndrome bits S1, S2, S3, S4, and S5 form the syndromes illustrated in columns SB-D, ADB-D, and ATB-D (S0 is omitted).

List 2

$S1 = d1\^d2\^d3\^d5\^d7\^d8\^d11\^d12\^d16\^P1$ $S2 = d1\^d2\^d3\^d4\^d6\^d10\^d11\^d14\^d16\^P2$ $S3 = d1\^d4\^d7\^d9\^d13\^d16\^P3$ $S4 = d2\^d5\^d6\^d9\^d12\^d14\^d15\^d16\^P4$ $S5 = d3\^d4\^d5\^d6\^d8\^d10\^d13\^d15\^P5$ $S0 = d1\^d2\^d3\^d4\^d5\^d6\^d7\^d8\^d9\^d10\^d11\^d12\^d13\^d14\^d15\^d16\^d17\^d18\^d19\^d20\^d21\^d22\^P1\^P2\^P3\^P4\^P5\^P0$

In general, in the example of FIG. 2 and the following examples of FIGS. 3-5, when no bit is in error, all of the parity bits are zero. When a single bit is in error, any of the parity bits other than P0 have a non-zero value while P0 is one. One exception is the case where P0 is in error. In that case, all parity bits other than P0 will be zero and P0 will be one. In the case of a double bit error, which is not illustrated in FIGS. 2-5, any of the parity bits other than P0 have a non-zero value while P0 is zero. In some cases, syndromes may be the same for one or more cases of single bit error and adjacent double bit error. In such cases, P0 is one for a single bit error and zero for an adjacent double bit error.

FIG. 3 illustrates another example ECC implementation. As pictured, FIG. 3 illustrates an ECC Matrix that may be used for encoding and/or decoding data. The example ECC implementation of FIG. 3, referred to herein as ECC(23,16), adds 7 parity bits to 22 data bits. Using the example ECC implementation of FIG. 3, a system is capable of detecting a no error case, detecting and correcting a single bit error, detecting double bit errors, detecting and correcting adjacent double bit errors, and detecting and correcting adjacent triple bit errors. Thus, ECC(23,16) provides improved error detection and correction compared to a Hamming Code implementation such as H(22,16) with the same number of data and n+1 parity bits. Further, the ECC implementation of FIG. 3 is capable of providing approximately 2× faster operation than conventional cyclic codes such as BCH codes.

The column labels in the example of FIG. 3 have the same meaning as described in connection with FIG. 2. In the example of FIG. 3, since 7 parity bits are used, an additional column T6 is included. Referring to FIG. 3, each syndrome corresponding to a single bit error within the single bit error space is unique. In other words, no syndrome is repeated in column SB-D.

Because each decimal value in column SB-D is unique, each syndrome is capable of identifying a particular bit that is corrupt. As such, the occurrence of a particular syndrome during decoding of a code word not only indicates the occurrence of a single bit error, but also specifies the particular bit of the code word that requires correcting. For example, a syndrome of 6 in decimal in column SB-D (corresponding to a binary value of "000110" in column SB-B) indicates that the value of bit d1 is incorrect.

Since there are "x" total bits (parity bits plus data bits), there are "x−1" possible adjacent double bit errors. In the example of FIG. 3, with a total of 23 bits in the code word, there are 22 possible adjacent double bit errors. Each decimal value within column ADB-D (and correspondingly binary value within column ADB-B) is unique. Thus, each syndrome corresponding to an adjacent double bit error within the adjacent double bit error space is unique. No syndrome is repeated in column ADB-D.

Because each syndrome in column ADB-D is unique, each syndrome is capable of identifying a particular adjacent double bit error. As such, the occurrence of a particular syndrome during decoding of a code word not only indicates the occurrence of an adjacent double bit error, but also specifies the particular adjacent double bits of the code word that require correcting. For example, a syndrome value of 40 in decimal in column ADB-D (corresponding to a binary value of "101000" in column ADB-B) indicates that the values of bits d7 and d6 are incorrect (e.g., the value of the bit position in the same row as the referenced syndrome and the value of the bit position or row immediately above).

Since there are "x" total bits, there are "x−2" possible adjacent triple bit errors. In the example of FIG. 3, with a total of 23 bits in the code word, there are 21 possible adjacent triple bit errors. Each decimal value within column ATB-D (and correspondingly binary value within column ATB-B) is unique. In other words, no syndrome is repeated in column ATB-D. Each syndrome within the adjacent triple bit error space is unique. As such, the occurrence of a particular syndrome during decoding of a code word not only indicates the occurrence of an adjacent triple bit error, but also specifies the particular adjacent triple bits of the code word that require correcting. For example, a syndrome value of 59 in decimal in column ADB-D (corresponding to a binary value of "111011" in column ADB-B) indicates that the values of bits d10, d9, and d8 are incorrect (e.g., the value of the bit position in the same row as the referenced syndrome and the value of the two bit positions or rows immediately above).

In the example of FIG. 3, parity bit P0 is used to differentiate between conditions where the code word has odd parity and even parity as described in connection with FIG. 2. Referring again to the single bit error space and the adjacent double bit error space in FIG. 3, there may be a syndrome of the single bit error space that is used in the adjacent double bit error space (or vice versa) since parity bit P0 is used to differentiate between the occurrence of a single bit error and an adjacent double bit error. The same situation occurs for the adjacent double bit error space and the adjacent triple bit error space of FIG. 3.

Because P0 is high for both single bit errors and adjacent triple bit errors, however, the syndromes of the single bit error space must be mutually exclusive with the syndromes of the adjacent triple bit error space. In other words, a syndrome used to indicate the occurrence of a single bit error may not be used to indicate the occurrence of any adjacent triple bit error and vice versa. Each syndrome of the combined space formed of the single bit error space and the adjacent triple bit error space are unique.

For purposes of encoding, P1 is calculated as the XOR of each bit position having a value of 1 in column T1. P2 is calculated as the XOR of each bit position having a value of 1 in column T2. P3 is calculated as the XOR of each bit position having a value of 1 in column T3. P4 is calculated as the XOR of each bit position having a value of 1 in column T4. P5 is calculated as the XOR of each bit position having a value of 1 in column T5. P6 is calculated as the XOR of each bit position having a value of 1 in column T6. P0 is calculated as the XOR of each bit position d1 to d22 and each of P1 to P6.

Based upon the foregoing and columns T1 to T6, an encoder is implemented to generate parity bits P0 to P6 using the expressions of List 3 below.

List 3

P1=d4^d5^d6^d7^d10^d11^d14^d16

P2=d1^d8^d11^d12^d15^d16

P3=d1^d2^d4^d9^d10^d11^d14

P4=d3^d7^d10^d11^d14

P5=d2^d3^d5^d8^d11^d15

P6=d6^d9^d12^d13^d14^d15^d16

P0=d1^d2^d3^d4^d5^d6^d7^d8^d9^d10^
 d11^d12^d13^d14^d15^d16^d17^
 d18^d19^d20^d21^d22^P1^P2^P3^P4^P5^P6

For purposes of decoding, syndrome S1 is calculated as the XOR of each bit position having a value of 1 in column T1 and P1. Syndrome S2 is calculated as the XOR of each bit position having a value of 1 in column T2 and P2. Syndrome S3 is calculated as the XOR of each bit position having a value of 1 in column T3 and P3. Syndrome S4 is calculated as the XOR of each bit position having a value of 1 in column T4 and P4. Syndrome S5 is calculated as the XOR of each bit position having a value of 1 in column T5 and P5. Syndrome S6 is calculated as the XOR of each bit position having a value of 1 in column T6 and P6. Syndrome S0 is calculated as the XOR of each bit position d1 to d22 and each of P0 to P6.

Accordingly, a decoder is implemented to generate syndrome bits S0 to S6 using the expressions of List 4 below. As noted, syndrome bits S1, S2, S3, S4, S5, and S6 form the syndromes illustrated in columns SB-D, ADB-D, and ATB-D (e.g., S0 is omitted).

List 4

S1=d4^d5^d6^d7^d10^d11^d14^d16^P1

S2=d1^d8^d11^d12^d15^d16^P2

S3=d1^d2^d4^d9^d10^d11^d14^P3

S4=d3^d7^d10^d13^d14^P4

S5=d2^d3^d5^d8^d11^d15^P5

S6=d6^d9^d12^d13^d14^d15^d16^P6

S0=d1^d2^d3^d4^d5^d6^d7^d8^d9^d10^
 d11^d12^d13^d14^d15^d16^d17^
 d18^d19^d20^d21^d22^P1^P2^P3^P4^P5^P6

FIG. 4 illustrates another example ECC implementation. As pictured, FIG. 4 illustrates an ECC Matrix that may be used for encoding and/or decoding data. The example ECC implementation of FIG. 4, referred to herein as ECC(39,32), adds 7 parity bits to 32 data bits. Using the example ECC implementation of FIG. 4, a system is capable of detecting a no error case, detecting and correcting a single bit error, detecting double bit errors, detecting and correcting adjacent double bit errors, and detecting adjacent triple bit errors. Thus, ECC(39,32) provides improved error detection and correction compared to a Hamming Code implementation such as H(39,32) with the same number of data and parity bits. Further, the ECC implementation of FIG. 4 is capable of providing approximately 1.5× faster operation than conventional cyclic codes such as BCH codes.

The column labels in the example of FIG. 4 have the same meaning as described in connection with FIG. 2. Referring to FIG. 4, each syndrome corresponding to a single bit error within the single bit error space is unique. In other words, no value is repeated in column SB-D.

Because each syndrome in column SB-D is unique, each syndrome is capable of identifying a particular bit that is corrupt. As such, the occurrence of a particular syndrome during decoding of a code word not only indicates the occurrence of a single bit error, but also specifies the particular bit of the code word that is corrupt. For example, a syndrome value of 13 in decimal in column SB-D (corresponding to a binary value of "001101" in column SB-B) indicates that the value of bit d1 is incorrect.

Since there are "x" total bits, there are "x−1" possible adjacent double bit errors. In the example of FIG. 4, with a total of 39 bits in the code word, there are 38 possible adjacent double bit errors. Each decimal value within column ADB-D (and correspondingly each binary value within column ADB-B) is unique. Each syndrome corresponding to an adjacent double bit error within the adjacent double bit error space is unique. In other words, no syndrome is repeated in column ADB-D.

Because each syndrome in column ADB-D is unique, each syndrome is capable of identifying a particular adjacent double bit error. As such, the occurrence of a particular syndrome during decoding of a code word not only indicates the occurrence of an adjacent double bit error, but also specifies the particular adjacent double bits of the code word that require correcting. For example, a syndrome value of 24 in decimal in column ADB-D (corresponding to a binary value of "011000" in column ADB-B) indicates that the values of bits d3 and d2 are incorrect (e.g., the value of the bit position in the same row as the referenced syndrome and the value of the bit position or row immediately above).

Since there are "x" total bits, there are "x−2" possible adjacent triple bit errors. In the example of FIG. 4, with a total of 39 bits in the code word, there are 37 possible adjacent triple bit errors. In the example of FIG. 4, decimal values within column ATB-D (and correspondingly binary values within column ATB-B) are not unique. In other words, one or more syndromes are repeated in column ATB-D. One or more syndromes in the adjacent triple bit error space may be repeated. Because syndromes in column ATB-D are not unique, the occurrence of a syndrome in ATB-D indicates the occurrence of an adjacent triple bit error in a code word, but not the particular adjacent triple bits of the code word that require correcting.

In the example of FIG. 4, parity bit P0 is used to differentiate between conditions where the code word has odd parity and even parity as described in connection with FIG. 2. Referring again to the single bit error space and the adjacent double bit error space in FIG. 4, there may be a syndrome value of the single bit error space that is used in the adjacent double bit error space (or vice versa) since parity bit P0 is used to differentiate between the occurrence of a single bit error and an adjacent double bit error. The same situation occurs for the adjacent double bit error space and the adjacent triple bit error space of FIG. 4.

Because P0 is high for both single bit errors and adjacent triple bit errors, however, the syndromes of the single bit error space must be mutually exclusive with the syndromes of the adjacent triple bit error space. In other words, a syndrome used to indicate the occurrence of a single bit error may not be used to indicate the occurrence of any adjacent triple bit error and vice versa. Each syndrome of the combined space formed of the single bit error space and the adjacent triple bit error space are unique.

For purposes of encoding, P1 is calculated as the XOR of each bit position having a value of 1 in column T1. P2 is calculated as the XOR of each bit position having a value of 1 in column T2. P3 is calculated as the XOR of each bit position having a value of 1 in column T3. P4 is calculated as the XOR of each bit position having a value of 1 in column T4. P5 is calculated as the XOR of each bit position having a value of 1 in column T5. P6 is calculated as the XOR of each bit position having a value of 1 in column T6. P0 is calculated as the XOR of each bit position d1 to d32 and each of P1 to P6.

Based upon the foregoing and columns T1 to T6, an encoder is implemented to generate parity bits P0 to P6 using the expressions of List 5 below.

List 5

$P1 = d1 \wedge d2 \wedge d3 \wedge d4 \wedge d5 \wedge d7 \wedge d8 \wedge d10 \wedge d11 \wedge d13 \wedge d14 \wedge d16 \wedge d17 \wedge d20 \wedge d21 \wedge d25 \wedge d26 \wedge d27 \wedge d28 \wedge d30 \wedge d31$ $P2 = d2 \wedge d3 \wedge d4 \wedge d6 \wedge d7 \wedge d8 \wedge d9 \wedge d10 \wedge d12 \wedge d14 \wedge d15 \wedge d16 \wedge d17 \wedge d18 \wedge d21 \wedge d23 \wedge d27 \wedge d28 \wedge d32$ $P3 = d1 \wedge d2 \wedge d3 \wedge d5 \wedge d6 \wedge d7 \wedge d9 \wedge d11 \wedge d13 \wedge d17 \wedge d18 \wedge d22 \wedge d23 \wedge d24 \wedge d25 \wedge d26 \wedge d27 \wedge d28 \wedge d29$ $P4 = d1 \wedge d3 \wedge d4 \wedge d5 \wedge d6 \wedge d8 \wedge d8 \wedge d11 \wedge d12 \wedge d14 \wedge d15 \wedge d18 \wedge d19 \wedge d27 \wedge d28 \wedge d29 \wedge d31 \wedge d32$ $P5 = d2 \wedge d4 \wedge d5 \wedge d6 \wedge d10 \wedge d12 \wedge d16 \wedge d22 \wedge d24 \wedge d26 \wedge d27 \wedge d28 \wedge d30 \wedge d31$ $P6 = d7 \wedge d8 \wedge d9 \wedge d10 \wedge d11 \wedge d12 \wedge d19 \wedge d20 \wedge d21 \wedge d23 \wedge d24 \wedge d25 \wedge d26 \wedge d27 \wedge d29 \wedge d30 \wedge d31 \wedge d32$ $P0 = d1 \wedge d2 \wedge d3 \wedge d4 \wedge d5 \wedge d6 \wedge d7 \wedge d8 \wedge d9 \wedge d10 \wedge d11 \wedge d12 \wedge d13 \wedge d14 \wedge d15 \wedge d16 \wedge d17 \wedge d18 \wedge d19 \wedge d20 \wedge d21 \wedge d22 \wedge P1 \wedge P2 \wedge P3 \wedge P4 \wedge P5 \wedge P6$ For purposes of decoding, syndrome S1 is calculated as the XOR of each bit position having a value of 1 in column T1 and P1. Syndrome S2 is calculated as the XOR of each bit position having a value of 1 in column T2 and P2. Syndrome S3 is calculated as the XOR of each bit position having a value of 1 in column T3 and P3. Syndrome S4 is calculated as the XOR of each bit position having a value of 1 in column T4 and P4. Syndrome S5 is calculated as the XOR of each bit position having a value of 1 in column T5 and P5. Syndrome S6 is calculated as the XOR of each bit position having a value of 1 in column T6 and P6. Syndrome S0 is calculated as the XOR of each bit position d1 to d32 and each of P0 to P6.

Accordingly, a decoder is implemented to generate syndrome bits S0 to S6 using the expressions of List 6 below. As noted, syndrome bits S1, S2, S3, S4, S5, and S6 form the syndromes illustrated in columns SB-D, ADB-D, and ATB-D (e.g., S0 is omitted).

List 6

S1=d1^d2^d3^d4^d5^d7^d8^d10^d11^d13^d14^d16^
   d17^d20^d21^d25^d26^d27^d28^d30^d31^P1

S2=d2^d3^d4^d6^d7^d8^d9^d10^d12^d14^d15^d16^
   d17^d18^d21^d23^d27^d28^d32^P2

S3=d1^d2^d3^d5^d6^d7^d9^d11^d13^d17^d18^d22^
   d23^d24^d25^d26^d27^d28^d29^P3

S4=d1^d3^d4^d5^d6^d8^d8^d11^d12^d14^d15^d18^
   d19^d27^d28^d29^d31^d32^P4

S5=d2^d4^d5^d6^d10^d12^d16^d22^d24^d26^d27^
   d28^d30^d31^P5

S6=d7^d8^d9^d10^d11^d12^d19^d20^d21^d23^
   d24^d25^d26^d27^d29^d30^d31^d32^P6

S0=^d2^d3^d4^d5^d6^d7^d8^d9^d10^d11^d12^
   d13^d14^d15^d16^d17^d18^d19^d20^
   d21^d22^P1^P2^P3^P4^P5^P6

FIG. 5 illustrates another example ECC implementation. As pictured, FIG. 5 illustrates an ECC Matrix that may be used for encoding and/or decoding data. The example ECC implementation of FIG. 5, referred to herein as ECC(40,32), adds 8 parity bits to 32 data bits. Using the example ECC implementation of FIG. 5, a system is capable of detecting a no error case, detecting and correcting a single bit error, detecting double bit errors, detecting and correcting adjacent double bit errors, and detecting and correcting adjacent triple bit errors. Thus, ECC(40,32) provides improved error detection and correction compared to a Hamming Code implementation such as H(39,32) with the same number of data and n+1 parity bits. Further, the ECC implementation of FIG. 5 is capable of providing approximately 2× faster operation than conventional cyclic codes such as BCH codes.

The column labels in the example of FIG. 5 have the same meaning as described in connection with FIG. 2. In the example of FIG. 5, since 8 parity bits are used, an additional column T7 is included. Referring to FIG. 5, each syndrome corresponding to a single bit error within the single bit error space is unique. In other words, no value is repeated in column SB-D.

Because each syndrome value in column SB-D is unique, each syndrome is capable of identifying a particular bit that is corrupt. As such, the occurrence of a particular syndrome during decoding of a code word not only indicates the occurrence of a single bit error, but also specifies the particular bit of the code word that requires correcting. For example, a syndrome value of 5 in decimal in column SB-D (corresponding to a binary value of "0000101" in column SB-B) indicates that the value of bit d1 is incorrect.

Since there are "x" total bits, there are "x−1" possible adjacent double bit errors. In the example of FIG. 3, with a total of 40 bits in the code word, there are 39 possible adjacent double bit errors. Each decimal value within column ADB-D (and correspondingly each binary value within column ADB-B) is unique. Each syndrome corresponding to an adjacent double bit error within the adjacent double bit error space is unique. In other words, no value is repeated in column ADB-D.

Because each syndrome value in column ADB-D is unique, each syndrome is capable of identifying a particular adjacent double bit error. As such, the occurrence of a particular syndrome during decoding of a code word not only indicates the occurrence of an adjacent double bit error, but also specifies the particular adjacent double bits of the code word that require correcting. For example, a syndrome value of 15 in decimal in column ADB-D (corresponding to a binary value of "0001111" in column ADB-B) indicates that the values of bits d2 and d1 are incorrect (e.g., the value of the bit position in the same row as the referenced syndrome and the value of the bit position or row immediately above).

Since there are "x" total bits, there are "x−2" possible adjacent triple bit errors. In the example of FIG. 5, with a total of 40 bits in the code word, there are 38 possible adjacent triple bit errors. Each decimal value within column ATB-D (and correspondingly binary value within column ATB-B) is unique. In other words, no syndrome is repeated in column ATB-D. Each syndrome within the adjacent triple bit error space is unique. As such, the occurrence of a particular syndrome during decoding of a code word not only indicates the occurrence of an adjacent triple bit error, but also specifies the particular adjacent triple bits of the code word that require correcting. For example, a syndrome value of 12 in decimal in column ADB-D (corresponding to a binary value of "0001100" in column ADB-B) indicates that the values of bits d3, d2, and d1 are incorrect (e.g., the value of the bit position in the same row as the referenced syndrome and the value of the two bit positions or rows immediately above).

In the example of FIG. 5, parity bit P0 is used to differentiate between conditions where the code word has odd parity and even parity as described in connection with FIG. 2. Referring again to the single bit error space and the adjacent double bit error space in FIG. 5, there may be a syndrome value of the single bit error space that is used in the adjacent double bit error space (or vice versa) since parity bit P0 is used to differentiate between the occurrence of a single bit error and an adjacent double bit error. The same situation occurs for the adjacent double bit error space and the adjacent triple bit error space of FIG. 5.

Because P0 is high for both single bit errors and adjacent triple bit errors, however, the syndromes of the single bit error space must be mutually exclusive with the syndromes of the adjacent triple bit error space. In other words, a syndrome used to indicate the occurrence of a single bit error may not be used to indicate the occurrence of any adjacent triple bit error and vice versa. Each syndrome of the combined space formed of the single bit error space and the adjacent triple bit error space are unique.

For purposes of encoding, P1 is calculated as the XOR of each bit position having a value of 1 in column T1. P2 is calculated as the XOR of each bit position having a value of 1 in column T2. P3 is calculated as the XOR of each bit position having a value of 1 in column T3. P4 is calculated as the XOR of each bit position having a value of 1 in column T4. P5 is calculated as the XOR of each bit position having a value of 1 in column T5. P6 is calculated as the XOR of each bit position having a value of 1 in column T6. P7 is calculated as the XOR of each bit position having a value of 1 in column T7. P0 is calculated as the XOR of each bit position d1 to d32 and each of P1 to P7.

Based upon the foregoing and columns T1 to T7, an encoder is implemented to generate parity bits P0 to P7 using the expressions of List 7 below.

List 7

P1=d1^d3^d4^d6^d9^d10^d11^d12^d15^d16^
   d18^d19^d23^d24^d25^d26^d29^d31

P2=d2^d3^d5^d7^d8^d9^d10^d12^d14^d16^
    d17^d21^d22^d23^d25^d29^d30^d31

P3=d1^d5^d6^d8^d9^d10^d13^d15^d19^d23^
    d28^d30^d31^d32

P4=d2^d6^d10^d14^d16^d20^d26^d29^d32

P5=d4^d7^d8^d9^d10^d15^d21^d24^d27^d30

P6=d11^d12^d13^d14^d17^d19^d20^d21^
    d23^d24^d27^d29^d30^d32

P7=d18^d22^d25^d26^d28^d31

P0=d1^d2^d3^d4^d5^d6^d7^d8^d9^d10^
    d11^d12^d13^d14^d15^d16^d17^d18^
    d19^d20^d21^d22^P1^P2^P3^P4^P5^P6^P7

For purposes of decoding, syndrome S1 is calculated as the XOR of each bit position having a value of 1 in column T1 and P1. Syndrome S2 is calculated as the XOR of each bit position having a value of 1 in column T2 and P2. Syndrome S3 is calculated as the XOR of each bit position having a value of 1 in column T3 and P3. Syndrome S4 is calculated as the XOR of each bit position having a value of 1 in column T4 and P4. Syndrome S5 is calculated as the XOR of each bit position having a value of 1 in column T5 and P5. Syndrome S6 is calculated as the XOR of each bit position having a value of 1 in column T6 and P6. Syndrome S7 is calculated as the XOR of each bit position having a value of 1 in column T7 and P7. Syndrome S0 is calculated as the XOR of each bit position d1 to d32 and each of P0 to P7.

Accordingly, a decoder is implemented to generate syndrome bits S0 to S7 using the expressions of List 8 below. As noted, syndrome bits S1, S2, S3, S4, S5, S6, and S7 form the syndromes illustrated in columns SB-D, ADB-D, and ATB-D (e.g., S0 is omitted).

List 8

S1=d1^d3^d4^d6^d9^d10^d11^d12^d15^
    d16^d18^d19^d23^d24^d25^d26^d29^d31^P1

S2=d2^d3^d5^d7^d8^d9^d10^d12^d14^
    d16^d17^d21^d22^d23^d25^d29^d30^d31^P2

S3=d1^d5^d6^d8^d9^d10^d13^d15^d19^
    d23^d28^d30^d31^d32^P3

S4=d2^d6^d10^d14^d16^d20^d26^d29^ d32^P4

S5=d4^d7^d8^d9^d10^d15^d21^d24^d27^ d30^P5

S6=d11^d12^d13^d14^d17^d19^d20^d21^
    d23^d24^d27^d29^d30^d32^P6

S7=d18^d22^d25^d26^d28^d31^P7

S0=d1^d2^d3^d4^d5^d6^d7^d8^d9^d10^
    d11^d12^d13^d14^d15^d16^d17^d18^
    d19^d20^d221^d22^P1^P2^P3^P4^P5^P6^P7^P0

Figure 6:
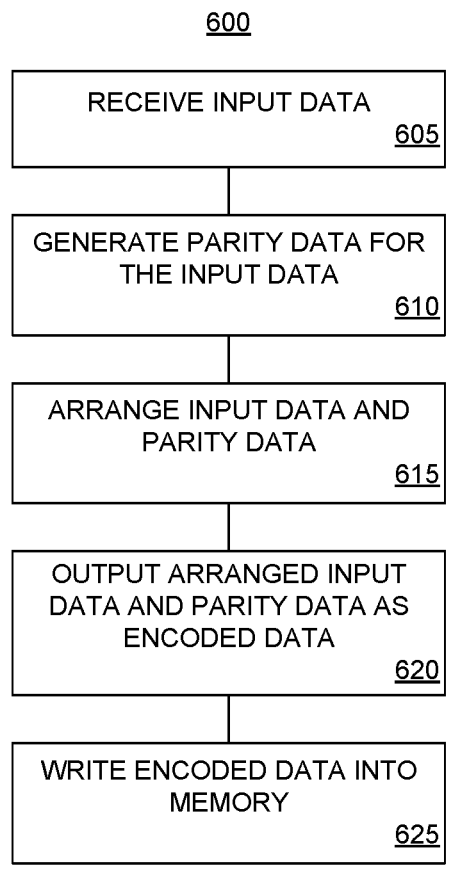
FIG. 6 illustrates an example method of encoding data in accordance with the inventive arrangements described herein.
Figure 7:
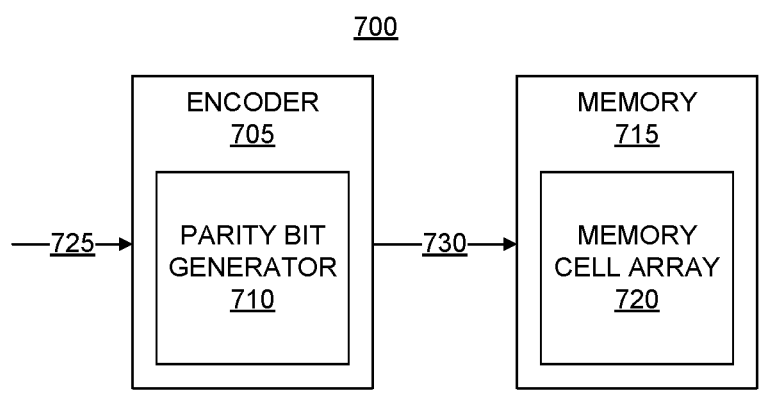
FIG. 7 illustrates an example encoding system.

FIG. 6 illustrates an example method 600 of encoding data in accordance with the inventive arrangements described herein. FIG. 7 illustrates an example encoding system 700. With simultaneous reference to FIGS. 6 and 7, method 600 and encoding system 700 are described. The blocks illustrated in FIG. 7 represent circuit blocks within a system such as an IC.

In block 605, encoder 705 receives input data 725. In one or more embodiments, encoder 705 is capable of receiving 16-bit data (e.g., words). In one or more other embodiments, encoder 705 is capable of receiving 32-bit data (e.g., words).

In block 610, encoder 705 is capable of generating parity data for the received input data. For example, parity bit generator 710 is capable of generating parity data, e.g., parity bits, for the received input data. In a 16-bit data implementation, encoder 705, is capable of implementing ECC(22,16) or ECC(23,16) encoding. In an embodiment, in response to receiving 16-bit data, encoder 705 is capable of generating six parity bits (P0 to P5) corresponding to the ECC(22,16) encoding scheme described in connection with FIG. 2 using the expressions of List 1. In another embodiment, in response to receiving 16-bit data, encoder 705 is capable of generating seven parity bits (P0 to P6) corresponding to the ECC(23,16) encoding scheme described in connection with FIG. 3 using the expressions of List 3.

In a 32-bit implementation, encoder 705, is capable of implementing ECC(39,32) or ECC(40,32) encoding. In an embodiment, in response to receiving 32-bit data, encoder 705 is capable of generating seven parity bits (P0 to P6) corresponding to the ECC(39,32) encoding scheme described in connection with FIG. 4 using the expressions of List 5. In another embodiment, in response to receiving 32-bit data, encoder 705 is capable of generating eight parity bits (P0 to P7) corresponding to the ECC(40,32) encoding scheme described in connection with FIG. 5 using the expressions of List 7.

In block 615, encoder 705 is capable of arranging the input data in the generated parity data and a predetermined bit-wise order as specified in the D-P column of FIG. 2, 3, 4, or 5 depending upon the type of encoding implemented.

In block 620, encoder 705 is capable of outputting the input data and the parity data arranged as described in block 615 as encoded data 730. In block 625, encoder 705 is capable of writing encoded data 730 to memory 715. In the example of FIG. 7, memory 715 includes a memory cell array 720. Memory cell array 720 includes a plurality of memory bits cells capable of storing encoded data 730. In one or more embodiments, memory 715 is a multibank memory. In particular embodiments, memory 715 is a single bank memory.

While FIGS. 6 and 7 illustrate an example where encoded data generated by encoder 705 is stored in a memory, in one or more other embodiments, encoded data 730 may be transmitted over a communication channel. Such communication channel may be wired or wireless. Further, such communication channel may occur prior to memory 715 or after memory 715.

Figure 8:
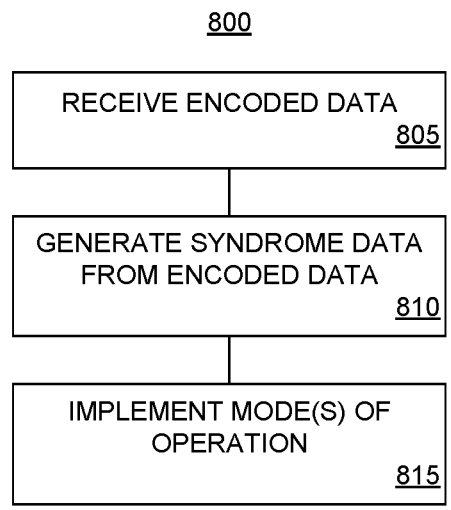
FIG. 8 illustrates an example method of decoding data in accordance with the inventive arrangements described herein.
Figure 9:
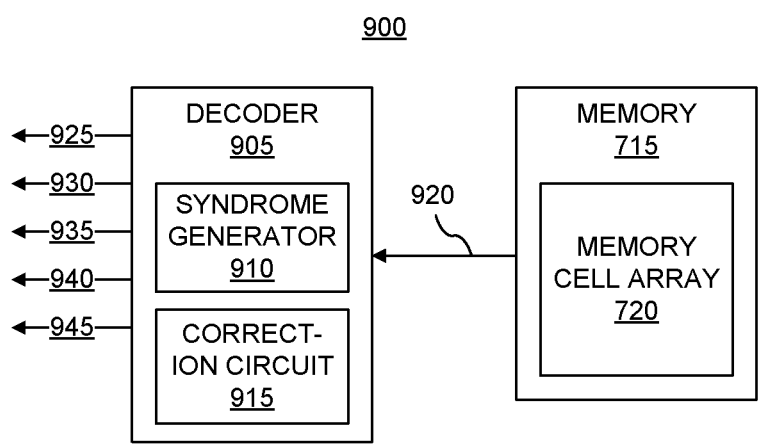
FIG. 9 illustrates an example decoding system.

FIG. 8 illustrates an example method 800 of decoding data in accordance with the inventive arrangements described herein. FIG. 9 illustrates an example decoding system 900. With simultaneous reference to FIGS. 8 and 9, method 800 and decoding system 900 are described. The blocks illustrated in FIG. 9 represent circuit blocks within a system such as an IC.

In block 805, decoder 905 is capable of receiving encoded data. In the example of FIG. 9, decoder 905 receives encoded data 920 from memory 715 and, more particularly, from memory cell array 720. Encoded data 920 may be encoded 16-bit data as described herein in connection with FIG. 2 or 3, or encoded 32-bit data as described in herein in connection with FIG. 4 or 5.

In block 810, decoder 905 is capable of generating syndrome data from encoded data 920 received in block 805. In the example of FIG. 8, syndrome generator 910 is capable of generating the syndrome bits from encoded data 920. For example, when encoded data 920 is ECC(22,16) encoded data as described in connection with FIG. 2, syndrome generator 910 is capable of generating syndrome bits S0 to S5 based on the expressions of List 2. In another example, when encoded data 920 is ECC(23,16) encoded data as described in connection with FIG. 3, syndrome generator 910 is capable of generating syndrome bits S0 to S6 using the expressions of List 4. In another example, when encoded data 920 is ECC(39,32) encoded data as described in connection with FIG. 4, syndrome generator 910 is capable of generating syndrome bits S0 to S6 using the expressions of List 6. In another example, when encoded data 920 is ECC(40,32) encoded data as described in connection with FIG. 5, syndrome generator 910 is capable of generating syndrome bits S0 to S7 using the expressions of List 8.

In block 815, decoder 905 is capable of implementing a particular mode of operation based upon the syndrome bits determined by syndrome generator 910 in block 810. Correction circuit 915, for example, is capable of implementing one of a plurality of different modes of operation based upon the syndrome bits generated by syndrome generator 910. The different modes of operation may include, but are not limited to, no detected error, single bit error, double bit error, adjacent double bit error, and adjacent triple bit error.

In the example of FIG. 9, decoder 905 is capable of outputting a variety of different signals illustrated as signals 925, 930, 935, 940, and 945. In the example of FIG. 9, decoder 905 is capable of outputting the decoded data as signal 925. In one or more embodiments, signal 925 includes decoded data bits only (e.g., no parity bits). In one or more other embodiments, signal 925 includes both decoded data bits and parity bits. Depending upon the mode of operation and implementation of decoder 905, signal 925 may specify correctly decoded data, decoded and corrected data, or decoded incorrect data (e.g., in cases where an error is detected but not corrected).

In one or more embodiments, decoder 905 is configured to output the syndrome bits generated by syndrome generator 910 as signal 930. In one or more other embodiments, decoder 905 does not output signal 930. Decoder 905 is also capable of outputting one or more error status signals indicating detection of a single bit error, an adjacent double bit error, and an adjacent triple bit error shown as signals 935, 940, and 945, respectively. In particular embodiments, decoder 905 is also capable of generating a status signal indicating a double bit error (not shown in FIG. 9).

In response to determining that the syndrome bits for a code word are all 0, correction circuit 915 enters a no error mode. In that case, each of error status signals 935, 940, and 945 may be pulled low indicating that no single bit error, no double bit error, no adjacent double bit error, and no adjacent triple bit error is detected. In that case, the decoded data may be output as signal 925 without any error correction applied thereto.

In response to determining that the syndrome bits S0 to SN for a code word indicate a single bit error, correction circuit 915 enters a single bit error mode. In the single bit error mode, a single bit, whether data or parity, of the code word has been flipped. In the single bit error mode, signal 935 is pulled high, while signals 940 and 945 remain low to indicate the detection of the single bit error. As described in connection with FIGS. 2, 3, 4, and 5, the syndrome bits S0 to SN indicate the particular bit that is in error and requires correction. The bit that requires correction may be a data bit or a parity bit. Accordingly, correction circuit 915 is capable of flipping the particular bit of the decoded data based upon the syndrome bits. The corrected data is output via signal 925.

In response to determining that the syndrome bits S0 to SN for a code word indicate an adjacent double bit error, correction circuit 915 enters an adjacent double bit error mode. In the adjacent double bit error mode, a pair of adjacent bits of the code word have been flipped. An adjacent pair of bits may both be parity bits, may both be data bits, or may include a parity bit and a data bit. In the adjacent double bit error mode, signal 940 is pulled high, while signals 935 and 945 remain low to indicate the detection of the adjacent double bit error. As described in connection with FIGS. 2, 3, 4, and 5, the syndrome bits S0 to SN indicate the particular pair of adjacent bits that are in error and require correction. Accordingly, correction circuit 915 is capable of flipping the two adjacent bits of the decoded data based upon the syndrome bits S0 to SN. The corrected data is output via signal 925.

In response to determining that the syndrome bits S0 to SN for a code word indicate an adjacent triple bit error, correction circuit 915 enters an adjacent triple bit error mode. In the adjacent triple bit error mode, three adjacent bits of the code word have been flipped. The three adjacent bits may all be parity bits, may all be data bits, or may include any mix of parity and data bits.

In one or more embodiments, where ECC(22,16) or ECC(39,32) is used, signal 945 is pulled high, while signals 935 and 940 remain low to indicate the detection of the adjacent triple bit error. In this example, the syndrome bits S0 to SN only indicate the occurrence of the adjacent triple bit error and are unable to indicate the particular set of 3 adjacent bits that require correction. In embodiments where adjacent triple bit errors cannot be corrected, a system coupled to decoder 905 is capable of taking other remedial action such as requesting the code word again from a source system or circuit.

In one or more other embodiments, where ECC(23,16) or ECC(40,32) is used, signal 945 is pulled high, while signals 935 and 940 remain low to indicate the detection of the adjacent triple bit error. In this example, the syndrome bits S0 to SN not only indicate the occurrence of the adjacent triple bit error, but also indicate the particular three adjacent bits that require correction. Accordingly, correction circuit 915 is capable of flipping the three adjacent bits of the decoded data based upon the syndrome bits S0 to SN. The corrected data is output via signal 925.

In the case where a double bit error is detected, a status signal (not shown) may indicate the detection of such an error condition. Further, since double bit errors cannot be corrected, a system coupled to decoder 905 is capable of taking other remedial action such as requesting the code word again from a source system or circuit.

While FIGS. 8 and 9 illustrate an example where encoded data generated received by decoder 905 is obtained from a memory, in one or more other embodiments, encoded data 920 may be transmitted over a communication channel. Such communication channel may be wired or wireless. Further, such communication channel may occur prior to memory 715 or after memory 715.

Figure 10:
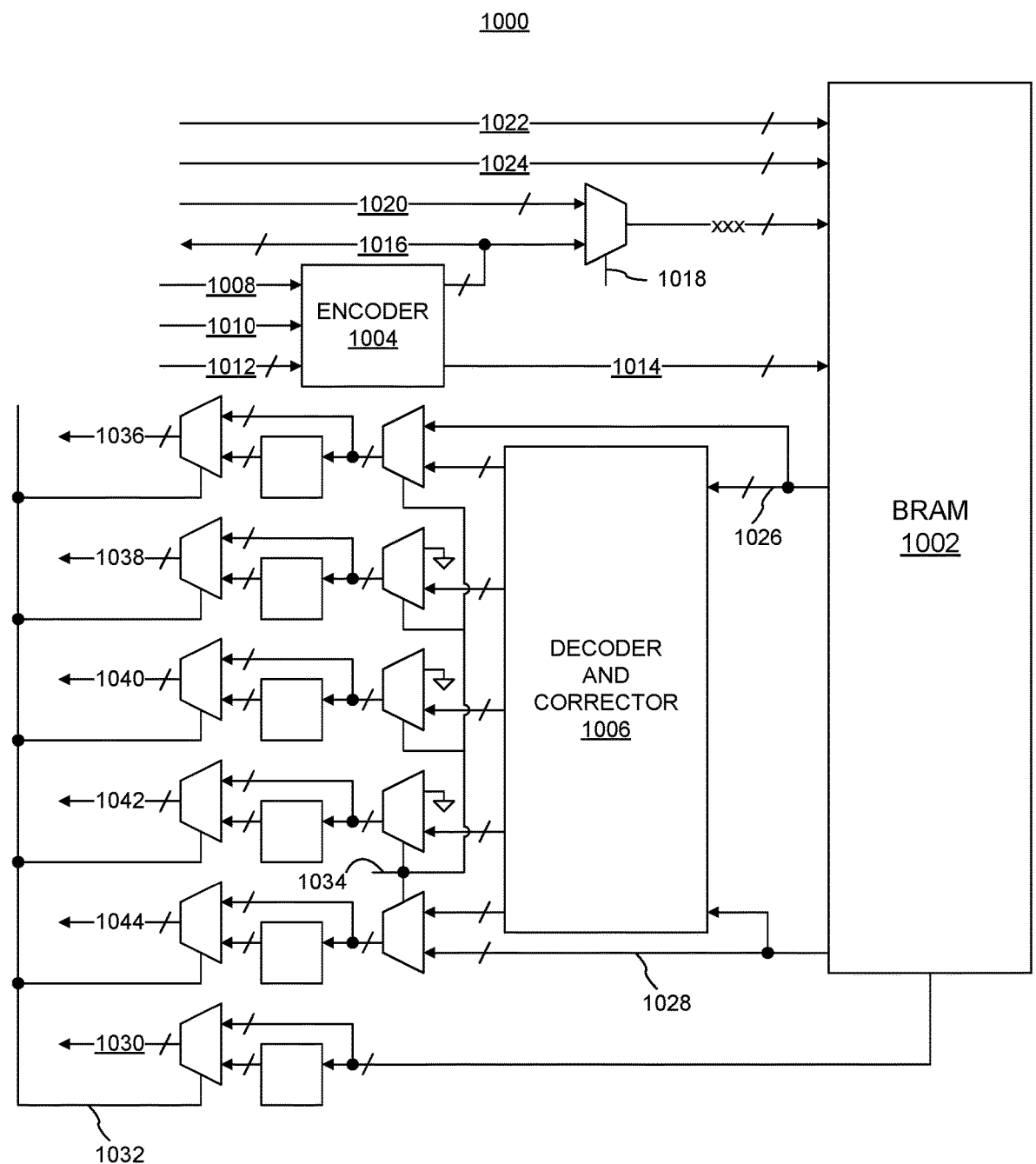
FIG. 10 is an example of an encoder/decoder (CODEC) system.

FIG. 10 is an example of an encoder/decoder (CODEC) system 1000. System 1000 is implemented in accordance with the principles described within this disclosure. In the example of FIG. 10, system 1000 includes a BRAM 1002, an encoder 1004, and a decoder and corrector 1006. Inputs to encoder 1004 include an inject single bit error signal 1008, inject double bit error signal 1010, and a data input signal 1012. Inject single bit error signal 1008 and inject double bit error signal 1010 correspond to functions that introduce a one bit error or a two bit error, respectively, into BRAM 1002 within memory. For purposes of illustration, BRAM 1002 is implemented to support 72-bit word size. Encoder 1004 is configured to operate as described herein to generate parity bits and code words (e.g., using an ECC Matrix as described herein in connection with FIG. 2, 3, 4, or 5). Outputs from encoder 1004 include a data input signal 1014 for BRAM 1002 and an ECC parity signal 1016, which is a multiplexed input to BRAM 1002 for a logic one state of an enable ECC write signal 1018. Another input to such multiplexer is a data input parity signal 1020, which is a multiplexed input to BRAM 1002 for a logic zero state of enable ECC write signal 1018. Other signals provided to BRAM 1002 include a write address signal 1022 and a read address signal 1024.

From BRAM 1002 are provided a data out signal 1026, a parity out signal 1028, and a data address ECC signal 1030. Data address ECC signal 1030 is a multiplexed output, which is a registered output for data output register select signal 1032 being a logic high and a non-registered output for data output register select signal 1032 being a logic low.

Data out signal 1026 and parity out signal 1028 are provided to decoder and corrector 1006, and data out signal 1026 and parity out signal 1028 are provided to respective multiplexers to bypass decoder and corrector 1006. A bypass mode is used when enable ECC read signal 1034 is logic low; however, when enable ECC read signal 1034 is logic high, data, parity, and syndrome bits, output from decoder and corrector 1006, are used. Thus, data output signal 1036 and parity out signal 1028 may be provided either through decoder and corrector 1006 or more directly from BRAM 1002. Syndrome bit output signals from decoder and corrector 1006 include double adjacent bit error signal 1038, single bit error signal 1040, and triple adjacent bit error signal 1042. Additionally, a double nonadjacent bit error signal may be output from decoder and corrector 1006, though not shown here. It should be understood that more adjacent bit error signals may be output from decoder and corrector 1006, for detection and correction of more than three adjacent bits in error with corresponding status signals also being output.

Data output parity 1044 may be parity out signal 1028 when decoder and corrector 1006 is bypassed, and thus parity bits of such parity out signal 1028 may be parity bits from ECC parity signal 1016 or data input parity 1020. However, when decoder and corrector 1006 is not bypassed, data output parity 1044 is syndrome bits output from decoder and corrector 1006. Such syndrome bits may be determined from data output signal 1026 and parity bits from either ECC parity signal 1016 or data input parity 1020. Such syndrome bits may be used to identify which bits are in error for use in response to a bit error signal being active high for example.

The embodiments described herein provide ECC implementations that are independent of the number of memory banks implemented within the memory that is used to store the encoded data. An encoder circuit block and a decoder circuit block may operate as described using any of the example ECC implementations herein with memories having one or more memory banks. In other conventional techniques, the codes generated often rely upon use of multiple, different memory banks (e.g., multiplexing of the data to different banks) to separate certain bit positions in order to detect and/or correct certain combinations of bit errors. The inventive arrangements described herein are capable of detecting and/or correcting the types of bit errors described (e.g., no bit error, single bit errors, double bit errors, adjacent double bit errors, and/or adjacent triple bit errors as the case may be) regardless of the number of memory banks implemented within the memory.

For example, in the case of a BRAM that supports 72-bit words, the BRAM may support a single bank of 72 bits, two banks of 36 bits, four banks of 18 bits, etc. The example embodiments described herein may be used in either BRAM configuration. In a configuration using four memory banks, for example, two bits of different code words may be in different memory banks.

Figure 11:
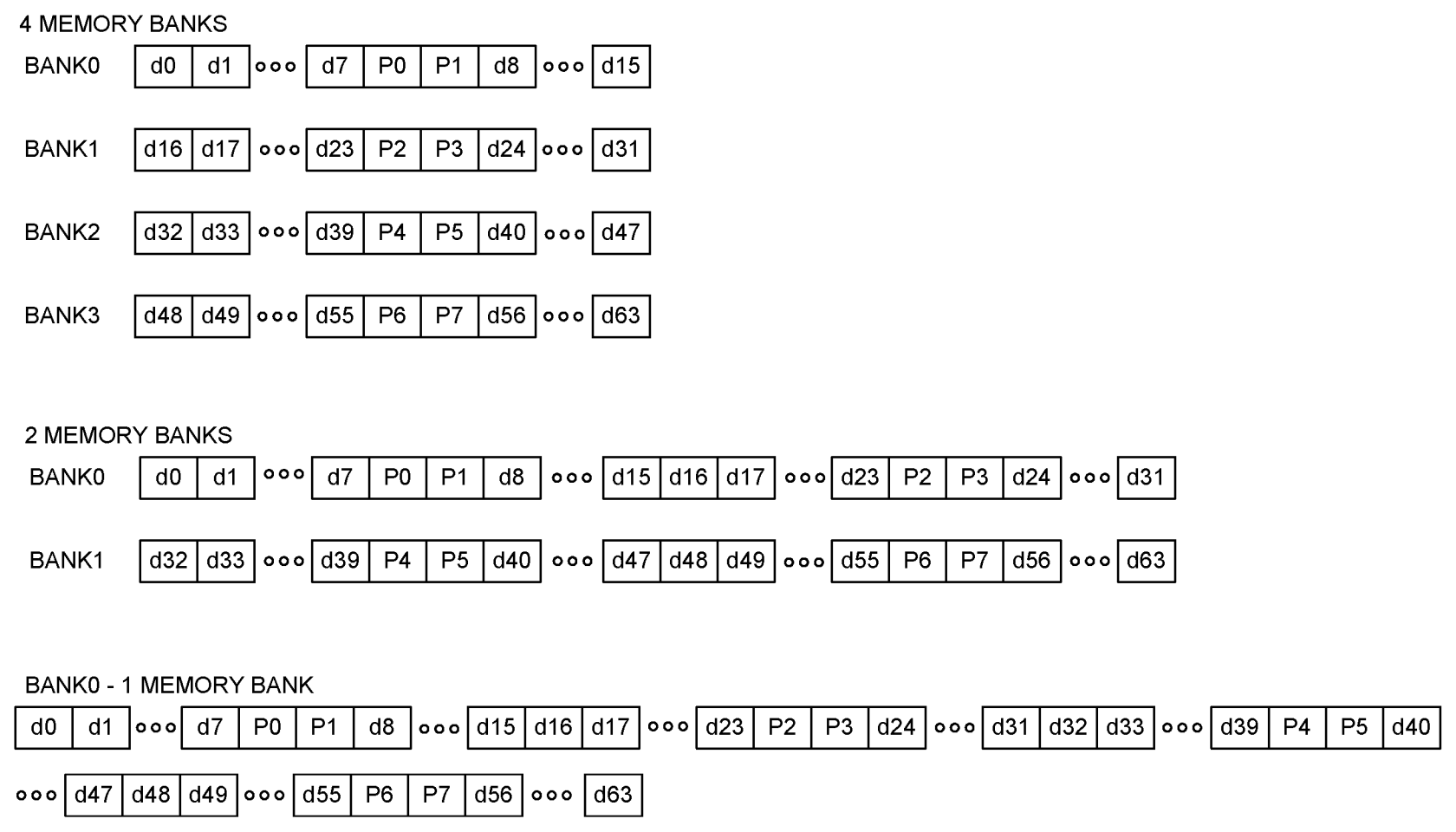

FIG. 11 illustrates an example of a conventional error correcting code implementation intended for use with a four bank memory. The example error correcting codes illustrated in FIG. 11 requires a particular number of banks, e.g., four in this case, to be effective. In the four bank memory example, it can be seen that bits (d15, d16), bits (d31, d32), and bits (d47, d48) are not physically adjacent to one another. Due to the physical arrangement of bits within the four memory banks, the error correcting code implementation of FIG. 11, being intended to operate in a memory bank with four memory banks, is not designed to detect adjacent bit errors that span bits (d15, d16), bits (d31, d32), and bits (d47, d48).

When the error correcting code implementation of FIG. 11 is used with a two bank memory configuration, bits (d15, d16) and bits (d47, d48) are adjacent to one another. Still, because the error correcting code is designed for use with four bank memories, the error correcting codes are unable to detect adjacent bit errors spanning bits (d15, d16), bits (d31, d32), and bits (d47, d48).

When the error correcting code implementation of FIG. 11 is used with a single memory bank configuration, bits (d15, d16), bits (d31, d32), and bits (d47, d48) are adjacent. Still, because the error correcting code is designed for use with four bank memories, the error correcting codes are unable to detect adjacent bit errors spanning bits (d15, d16), bits (d31, d32), and bits (d47, d48).

FIG. 12 illustrates another example of the ECC(39,32) implementation described herein. In the single memory bank example of FIG. 12, the bits are arranged as illustrated with 38 possible adjacent bit combinations. The ECC(39,32) implementation is capable of detecting and correcting the various types of errors described (e.g., detecting a no bit error, detecting and correcting a single bit error, detecting a double bit error, detecting and correcting an adjacent double bit error, and detecting an adjacent triple bit error) even when a single bank memory is used. Similarly, the ECC(39, 32) implementation is capable of operating as described using a memory with two memory banks, four memory banks, or more memory banks.

FIG. 12 is provided to illustrate that the ECC(39,32) implementation is capable of operating as described herein despite the number of memory banks in the memory that is used to store encoded data. The ECC(39,32) implementation is independent of the number of memory banks used. While not illustrated, each of the ECC(40,32), ECC(22,16), and ECC(23,16) implementations are also capable of operating as described herein for each respective implementation despite the number of memory banks in the memory that is used to store encoded data. The ECC(40,32), ECC(22,16), and ECC(23,16) implementations are independent of the number of memory banks used.

The example embodiments described herein have been described with reference to 16-bit and 32-bit words. It should be appreciated that the principles describe within this disclosure may be extended and applied to other word sizes. For purposes of illustration, the following examples are provided.

In one or more embodiments, the principles described herein can be applied to word sizes of 128 bits. For example, an ECC implementation may be implemented such as ECC (137,128) capable of detecting a no error case, detecting and correcting single bit errors, detecting double bit errors, detecting and correcting adjacent double bit errors, and detecting adjacent triple bit errors. ECC(138,128) may be implemented which is capable detecting a no error case, detecting and correcting single bit errors, detecting double bit errors, detecting and correcting adjacent double bit errors, and detecting and correcting adjacent triple bit errors.

In one or more other embodiments, the principles described herein may be extended and applied to a word size of 256 bits. For example, an ECC implementation may be implemented such as ECC(266,256) capable of detecting a no error case, detecting and correcting single bit errors, detecting double bit errors, detecting and correcting adjacent double bit errors, and detecting adjacent triple bit errors. ECC(267,256) may be implemented which is capable detecting a no error case, detecting and correcting single bit errors, detecting double bit errors, detecting and correcting adjacent double bit errors, and detecting and correcting adjacent triple bit errors.

In one or more other embodiments, the principles described herein may be extended and applied to a word size of 512 bits. For example, an ECC implementation may be implemented such as ECC(523,512) capable of detecting a no error case, detecting and correcting single bit errors, detecting double bit errors, detecting and correcting adjacent double bit errors, and detecting adjacent triple bit errors. ECC(524,512) may be implemented which is capable detecting a no error case, detecting and correcting single bit errors, detecting double bit errors, detecting and correcting adjacent double bit errors, and detecting and correcting adjacent triple bit errors.

In one or more other embodiments, the principles described herein may be extended and applied to a word size of 1024 bits. For example, an ECC implementation may be implemented such as ECC(1036,1024) capable of detecting a no error case, detecting and correcting single bit errors, detecting double bit errors, detecting and correcting adjacent double bit errors, and detecting adjacent triple bit errors. ECC(1037,1024) may be implemented which is capable detecting a no error case, detecting and correcting single bit errors, detecting double bit errors, detecting and correcting adjacent double bit errors, and detecting and correcting adjacent triple bit errors.

In one or more other embodiments, the principles described herein may be extended and applied to a word size of 2048 bits. For example, an ECC implementation may be implemented such as ECC(2061,2048) capable of detecting a no error case, detecting and correcting single bit errors, detecting double bit errors, detecting and correcting adjacent double bit errors, and detecting adjacent triple bit errors. ECC(2062,2048) may be implemented which is capable detecting a no error case, detecting and correcting single bit errors, detecting double bit errors, detecting and correcting adjacent double bit errors, and detecting and correcting adjacent triple bit errors.

In one or more other embodiments, the principles described herein may be extended and applied to a word size of 4096 bits. For example, an ECC implementation may be implemented such as ECC(4110,4096) capable of detecting a no error case, detecting and correcting single bit errors, detecting double bit errors, detecting and correcting adjacent double bit errors, and detecting adjacent triple bit errors. ECC(4111,4096) may be implemented which is capable detecting a no error case, detecting and correcting single bit errors, detecting double bit errors, detecting and correcting adjacent double bit errors, and detecting and correcting adjacent triple bit errors.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

The flowchart and block diagrams in the Figures illustrate the architecture, functionality, and operation of possible implementations of systems and methods according to various aspects of the inventive arrangements. In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, an apparatus includes an encoder circuit block. The encoder circuit block is configured to receive input data. The encoder circuit block is configured to generate a plurality of parity bits from the input data and order the input data and the plurality of parity bits to generate encoded data. The encoder circuit block is configured to generate each of the plurality of parity bits based upon selected bits of the input data, and order the input data and the plurality of parity bits so that a decoder circuit block configured to decode the encoded data is able to perform operations including, at least in part, detecting a no bit error, detecting and correcting a single bit error, detect a double bit error, detecting and correcting an adjacent double bit error, and detecting an adjacent triple bit error. The operations are independent of a number of memory banks of a memory used to store the encoded data. In particular embodiments, the decoder circuit block is further configured to perform operations including correcting adjacent triple bit errors.

In an aspect, the encoder circuit block and the decoder circuit block are configured to operate independently of a number of memory banks within a memory used to store the encoded data.

In another aspect, the encoder circuit block is configured to generate the plurality of parity bits so that each syndrome corresponding to a single bit error is unique within a single bit error space and each syndrome corresponding to an adjacent double bit error is unique within an adjacent double bit error space.

In another aspect, the encoder circuit block is configured to generate the plurality of parity bits so that at least one of the syndromes corresponding to the single bit error has a same value as at least one of the syndromes corresponding to the adjacent double bit error. The syndromes corresponding to the single bit error have a different value of a P0 parity bit than the syndromes corresponding to the adjacent double bit error.

In another aspect, the encoder circuit block is configured to generate the plurality of parity bits so that syndromes corresponding to the adjacent triple bit error are mutually exclusive with syndromes corresponding to the single bit error.

In another aspect, the encoder circuit block is configured to generate the plurality of parity bits so that at least one of the syndromes corresponding to the adjacent double bit error overlaps with at least one of the syndromes corresponding to the adjacent triple bit error. The syndromes corresponding to the adjacent double bit error have a different value of the P0 parity bit than the syndromes corresponding to the adjacent triple bit error.

In another aspect, the encoder circuit block is configured to generate the plurality of parity bits so that at least two syndromes corresponding to the adjacent triple bit error have a same value.

In another aspect, the encoder circuit block is configured to generate the plurality of parity bits so that the decoder circuit block configured to decode the encoded data performs operations including correcting the adjacent triple bit error, wherein each syndrome corresponding to the adjacent triple bit error is unique within an adjacent triple bit error space.

In another aspect, the apparatus includes the decoder circuit block. The decoder circuit block is configured to generate syndrome bits from the encoded data and, based upon the generated syndrome bits, detect the no bit error, detect the single bit error, detect the double bit error, detect and correct the adjacent double bit error, and detect the adjacent triple bit error.

In another aspect, the decoder circuit block is further configured to correct the adjacent triple bit error.

In one or more embodiments, an apparatus includes a decoder circuit block. The decoder circuit block is configured to receive encoded data and generate a plurality of syndrome bits from the encoded data. The decoder circuit block is configured, in response to generating the plurality of syndrome bits, to perform operations including, at least in part, detecting a no bit error, detecting and correcting a single bit error, detecting a double bit error, detecting and correcting an adjacent double bit error, and detecting an adjacent triple bit error. The operations are independent of a number of memory banks of a memory used to store the encoded data. In particular embodiments, the decoder circuit block is further configured to perform operations including correcting adjacent triple bit errors.

In one aspect, the decoder circuit block is configured to operate independently of a number of memory banks within a memory used to store the encoded data.

In another aspect, the decoder circuit block is configured to generate the plurality of syndrome bits so that each syndrome corresponding to a single bit error is unique within a single bit error space and each syndrome corresponding to an adjacent double bit error is unique within an adjacent double bit error space.

In another aspect, the decoder circuit block is configured to generate the plurality of syndrome bits so that at least one of the syndromes corresponding to the single bit error has a same value as at least one of the syndromes corresponding to the adjacent double bit error. The syndromes corresponding to the single bit error have a different value of a P0 parity bit than the syndromes corresponding to the adjacent double bit error.

In another aspect, the decoder circuit block is configured to generate the plurality of syndrome bits so that each syndrome corresponding to the adjacent triple bit error has a value that is different than a value of each syndrome corresponding to the single bit error.

In another aspect, the decoder circuit block is configured to generate the plurality of syndrome bits so that at least one of the syndromes corresponding to the adjacent double bit error overlaps with at least one of the syndromes corresponding to the adjacent triple bit error. The syndromes corresponding to the adjacent double bit error have a different value of the P0 parity bit than the syndromes corresponding to the adjacent triple bit error.

In another aspect, the decoder circuit block is configured to generate the plurality of syndrome bits so that at least two syndromes corresponding to the adjacent triple bit error have a same value.

In another aspect, the decoder circuit block is further configured to correct the adjacent triple bit error, wherein each syndrome corresponding to the adjacent triple bit error is unique within an adjacent triple bit error space.

In one or more embodiments, a method of encoding data for error correction includes receiving input data, generating a plurality of parity bits for the input data based on selected bits of the input data, arranging the input data into encoded data by ordering the input data and the plurality of parity bits so that a decoder circuit block configured to decode the encoded data performs operations including detecting a no bit error, detecting and correcting a single bit error, detecting a double bit error, detecting and correcting an adjacent double bit error, and detecting an adjacent triple bit error, and storing the encoded data in a memory. The operations are independent of a number of memory banks within the memory.

In another aspect, the decoding further includes correcting the adjacent triple bit errors.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. An apparatus, comprising:
    an encoder circuit block configured to receive input data, generate a plurality of parity bits from the input data; and order the input data and the plurality of parity bits to generate encoded data;
    wherein the encoder circuit block is configured to generate each of the plurality of parity bits based upon selected bits of the input data and order the input data and the plurality of parity bits so that a decoder circuit block configured to decode the encoded data performs operations including detecting a no bit error, detecting and correcting a single bit error, detecting a double bit error, detecting and correcting an adjacent double bit error, and detecting an adjacent triple bit error;
    wherein the encoder circuit block is configured to order the input data and the plurality of parity bits so that the encoded data begins with at least one of the plurality of parity bits; and
    wherein the decoder is operable to detect the no bit error, detect and correct the single bit error, detect the double bit error, detect and correct the adjacent double bit error, and detect the adjacent triple bit error in a memory having a single memory bank used to store the encoded data and in a memory having a plurality of memory banks used to store the encoded data.

2. The apparatus of claim 1, wherein the encoded data begins with two or more consecutive parity bits of the plurality of parity bits.

3. The apparatus of claim 1, wherein the encoder circuit block is configured to generate the plurality of parity bits so that:
    each syndrome corresponding to a single bit error is unique within a single bit error space; and
    each syndrome corresponding to an adjacent double bit error is unique within an adjacent double bit error space.

4. The apparatus of claim 3, wherein the encoder circuit block is configured to generate the plurality of parity bits so that at least one of the syndromes corresponding to the single bit error has a same value as at least one of the syndromes corresponding to the adjacent double bit error, wherein the syndromes corresponding to the single bit error have a different value of a P0 parity bit than the syndromes corresponding to the adjacent double bit error.

5. The apparatus of claim 4, wherein the encoder circuit block is configured to generate the plurality of parity bits so that syndromes corresponding to the adjacent triple bit error are mutually exclusive with syndromes corresponding to the single bit error.

6. The apparatus of claim 5, wherein the encoder circuit block is configured to generate the plurality of parity bits so that at least one of the syndromes corresponding to the adjacent double bit error overlaps with at least one of the syndromes corresponding to the adjacent triple bit error, wherein the syndromes corresponding to the adjacent double bit error have a different value of the P0 parity bit than the syndromes corresponding to the adjacent triple bit error.

7. The apparatus of claim 6, wherein the encoder circuit block is configured to generate the plurality of parity bits so that at least two syndromes corresponding to the adjacent triple bit error have a same value.

8. The apparatus of claim 6, wherein the encoder circuit block is configured to generate the plurality of parity bits so that the decoder circuit block configured to decode the encoded data performs operations including correcting the adjacent triple bit error, wherein each syndrome corresponding to the adjacent triple bit error is unique within an adjacent triple bit error space.

9. The apparatus of claim 1, further comprising:
the decoder circuit block, wherein the decoder circuit block is configured to generate syndrome bits from the encoded data and, based upon the generated syndrome bits, detect the no bit error, detect and correct the single bit error, detect the double bit error, detect and correct the adjacent double bit error, and detect the adjacent triple bit error.

10. The apparatus of claim 9, wherein the decoder circuit block is further configured to correct the adjacent triple bit error.

11. An apparatus, comprising:
a decoder circuit block configured to receive encoded data and generate a plurality of syndrome bits from the encoded data;
wherein the decoder circuit block is configured, in response to generating the plurality of syndrome bits, to perform operations including detecting a no bit error, detecting and correcting a single bit error, detecting a double bit error, detecting and correcting an adjacent double bit error, and detecting an adjacent triple bit error; and
wherein the encoded data includes input data and a plurality of parity bits and is ordered to begin with at least one of the plurality of parity bits; and
wherein the decoder is operable to detect the no bit error, detect and correct the single bit error, detect the double bit error, detect and correct the adjacent double bit error, and detect the adjacent triple bit error in a memory having a single memory bank used to store the encoded data and in a memory having a plurality of memory banks used to store the encoded data.

12. The apparatus of claim 11, wherein the encoded data begins with two or more consecutive parity bits of the plurality of parity bit.

13. The apparatus of claim 11, wherein the decoder circuit block is configured to generate the plurality of syndrome bits so that:
each syndrome corresponding to a single bit error is unique within a single bit error space; and
each syndrome corresponding to an adjacent double bit error is unique within an adjacent double bit error space.

14. The apparatus of claim 13, wherein the decoder circuit block is configured to generate the plurality of syndrome bits so that:
at least one of the syndromes corresponding to the single bit error has a same value as at least one of the syndromes corresponding to the adjacent double bit error, wherein the syndromes corresponding to the single bit error have a different value of a P0 parity bit than the syndromes corresponding to the adjacent double bit error; and
each syndrome corresponding to the adjacent triple bit error has a value that is different than a value of each syndrome corresponding to the single bit error.

15. The apparatus of claim 14, wherein the decoder circuit block is configured to generate the plurality of syndrome bits so that at least one of the syndromes corresponding to the adjacent double bit error overlaps with at least one of the syndromes corresponding to the adjacent triple bit error, wherein the syndromes corresponding to the adjacent double bit error have a different value of the P0 parity bit than the syndromes corresponding to the adjacent triple bit error.

16. The apparatus of claim 15, wherein the decoder circuit block is configured to generate the plurality of syndrome bits so that at least two syndromes corresponding to the adjacent triple bit error have a same value.

17. The apparatus of claim 15, wherein the decoder circuit block is further configured to correct the adjacent triple bit error, wherein each syndrome corresponding to the adjacent triple bit error is unique within an adjacent triple bit error space.

18. The apparatus of claim 11, wherein the decoder circuit block is further configured to correct the adjacent triple bit error.

19. A method of encoding data for error correction, comprising:
receiving input data;
generating a plurality of parity bits for the input data based on selected bits of the input data;
arranging the input data into encoded data by ordering the input data and the plurality of parity bits so that a decoder circuit block configured to decode the encoded data performs operations including detecting a no bit error, detecting and correcting a single bit error, detecting a double bit error, detecting and correcting an adjacent double bit error, and detecting an adjacent triple bit error;
wherein the encoder data begins with at least one of the plurality of parity bits storing the encoded data in a memory;
wherein the operations are independent of a number of memory banks within the memory; and
wherein the decoder is operable to detect the no bit error, detect and correct the single bit error, detect the double bit error, detect and correct the adjacent double bit error, and detect the adjacent triple bit error in the memory when the memory has a single memory bank used to store the encoded data and when the memory has a plurality of memory banks used to store the encoded data.

20. The method of claim 19, where the decoding further comprises correcting the adjacent triple bit errors.

* * * * *